US012588402B2

(12) United States Patent
Kim et al.

(10) Patent No.: US 12,588,402 B2
(45) Date of Patent: Mar. 24, 2026

(54) ELECTRONIC DEVICE

(71) Applicant: Samsung Display Co., Ltd., Yongin-si (KR)

(72) Inventors: Taeho Kim, Yongin-si (KR); Hyeoji Kang, Seoul (KR); Ohjeong Kwon, Hwaseong-si (KR); Hongyeon Lee, Suwon-si (KR); Seungyeon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 787 days.

(21) Appl. No.: 17/882,374

(22) Filed: Aug. 5, 2022

(65) Prior Publication Data

US 2023/0076553 A1     Mar. 9, 2023

(30) Foreign Application Priority Data

Sep. 8, 2021    (KR) ........................ 10-2021-0119869

(51) Int. Cl.
H10K 65/00          (2023.01)
G06V 40/13          (2022.01)
(Continued)

(52) U.S. Cl.
CPC ......... H10K 65/00 (2023.02); G06V 40/1318 (2022.01); H10K 39/32 (2023.02);
(Continued)

(58) Field of Classification Search
CPC .... H10K 39/32; H10K 50/865; H10K 59/121; H10K 59/122; H10K 59/40;
(Continued)

(56) References Cited

U.S. PATENT DOCUMENTS 9,368,557 B2     6/2016  Suzuki et al.
9,793,515 B2     10/2017  Choi et al.
(Continued)

FOREIGN PATENT DOCUMENTS

EP          3886196 A1 *  9/2021   ......... H10K 59/8792
JP          2005-250091 A     9/2005
(Continued)

OTHER PUBLICATIONS

Korean Notice of Allowance corresponding to KR Application No. 10-2021-0119869, dated Dec. 17, 2025 (7 pages).

*Primary Examiner* — Telly D Green
(74) *Attorney, Agent, or Firm* — Womble Bond Dickinson (US) LLP

(57)          ABSTRACT

An electronic device includes: a base layer; a display element layer on the base layer; and a reflection control layer on the display element layer and comprising a dye, the display element layer comprising: a pixel definition layer having first, second, and third openings formed therethrough; a first light emitting element corresponding to the first opening and emitting a first light; a second light emitting element corresponding to the second opening and emitting a second light different from the first light; a light receiving element corresponding to the third opening; and an inorganic absorbing layer on the first and second light emitting elements, and wherein the reflection control layer overlaps the first light emitting element and the second light emitting element.

20 Claims, 15 Drawing Sheets

(51) Int. Cl.
    *H10K 39/32*       (2023.01)
    *H10K 59/122*     (2023.01)
    *H10K 59/40*       (2023.01)
    *H10K 59/80*       (2023.01)

(52) U.S. Cl.
    CPC ........... *H10K 59/122* (2023.02); *H10K 59/40*
        (2023.02); *H10K 59/8792* (2023.02)

(58) Field of Classification Search
    CPC ........... H10K 59/8791; H10K 59/8792; H10K
        65/00; G06V 40/1318
    See application file for complete search history.

(56)            References Cited

U.S. PATENT DOCUMENTS

| 10,510,814 | B2 | | 12/2019 | Sun et al. | |
|---|---|---|---|---|---|
| 10,552,696 | B2 | | 2/2020 | Cho et al. | |
| 11,194,432 | B2 | * | 12/2021 | Kim | .................. G06F 3/04164 |

| 11,871,612 | B2 | * | 1/2024 | Kim | ..................... H10K 50/858 |
|---|---|---|---|---|---|
| 2006/0158403 | A1 | | 7/2006 | Kuma | |
| 2015/0159836 | A1 | | 6/2015 | Tamak et al. | |
| 2018/0120625 | A1 | | 5/2018 | Chen et al. | |
| 2020/0364436 | A1 | | 11/2020 | Beon et al. | |
| 2021/0126173 | A1 | * | 4/2021 | Jeon | ..................... H04M 1/0264 |
| 2022/0020967 | A1 | * | 1/2022 | Kim | ..................... H10K 59/352 |
| 2023/0096610 | A1 | * | 3/2023 | Kim | ..................... H10K 50/865 |
| | | | | | 257/91 |

FOREIGN PATENT DOCUMENTS

| KR | 10-2007-0042153 | A | 4/2007 |
|---|---|---|---|
| KR | 10-2015-0020504 | A | 2/2015 |
| KR | 10-2017-0060216 | A | 6/2017 |
| KR | 10-2017-0063297 | A | 6/2017 |
| KR | 10-2018-0067196 | A | 6/2018 |
| KR | 10-2042534 | B1 | 11/2019 |
| KR | 10-2020-0131932 | A | 11/2020 |
| WO | WO 2018113207 | A1 | 6/2018 |

* cited by examiner

FIG. 6A

ELECTRONIC DEVICE

CROSS-REFERENCE TO RELATED APPLICATION

The present application claims priority to and the benefit of Korean Patent Application No. 10-2021-0119869, filed on Sep. 8, 2021 under 35 U.S.C. § 119, the entire content of which is hereby incorporated by reference.

BACKGROUND

1. Field

Aspects of some embodiments of the present disclosure relate to an electronic device.

2. Description of the Related Art

Multimedia electronic devices, such as televisions, mobile phones, tablet computers, navigation units, and game units, include a display device to display images and an input sensing device to sense external input, for example, from touch input. For example, some electronic devices may have a function to detect a fingerprint of a user.

Methods for sensing a user's fingerprint may include, for example, a capacitive method that senses a variation in capacitance formed between electrodes, an optical method that senses an incident light using an optical sensor, and an ultrasonic method that senses a vibration using a piezoelectric material. Meanwhile, when the sensor of the optical method is employed, it is required to block the noises, e.g., noises caused by an external light, to improve the fingerprint recognition performance.

The above information disclosed in this Background section is only for enhancement of understanding of the background and therefore the information discussed in this Background section does not necessarily constitute prior art.

SUMMARY

Aspects of some embodiments of the present disclosure relate to an electronic device. For example, some embodiments of the present disclosure relate to an electronic device including a light receiving element in a display area thereof.

Aspects of some embodiments of the present disclosure include an electronic device including a light receiving element with relatively improved sensitivity by improving a transmittance with respect to a sensing light and reducing noise caused by external light.

Aspects of some embodiments of the inventive concept include an electronic device including a base layer; a display element layer on the base layer; and a reflection control layer on the display element layer and including a dye. The display element layer includes a pixel definition layer provided with first, second, and third openings defined therethrough; a first light emitting element corresponding to the first opening and emitting a first light; a second light emitting element corresponding to the second opening and emitting a second light different from the first light; a light receiving element corresponding to the third opening; and an inorganic absorbing layer on the first and second light emitting elements. The reflection control layer overlaps the first light emitting element and the second light emitting element.

According to some embodiments, the reflection control layer includes a first dye having a maximum absorption wavelength within a range from about 420 nm to about 500 nm and a second dye having a maximum absorption wavelength within a range from about 560 nm to about 620 nm.

According to some embodiments, the reflection control layer includes at least one of a porphyrin-based dye or a tetraazaporphyrin-based dye.

According to some embodiments, the reflection control layer further includes at least one of an infrared absorber or an ultraviolet absorber.

According to some embodiments, the reflection control layer is provided with an opening pattern defined therethrough, and the opening pattern overlaps the light receiving element when viewed in a plane.

According to some embodiments, the electronic device further includes an organic pattern portion in the opening pattern, and the organic pattern portion includes at least one of a green dye or a yellow dye.

According to some embodiments, the organic pattern portion includes at least one of a phthalocyanine-based dye or a quinophthalone-based dye.

According to some embodiments, the organic pattern portion further includes an infrared absorber, and the infrared absorber includes at least one of a diimmonium-based compound, a squarylium-based compound, a cyanine-based compound, a phthalocyanine-based compound, or a dithiolene-based compound.

According to some embodiments, the organic pattern portion further includes an ultraviolet absorber, and the ultraviolet absorber includes at least one of a triazine-based compound or a benzotriazole-based compound.

According to some embodiments, the display element layer further includes a low adhesion pattern on the light receiving element, and the inorganic absorbing layer does not overlap the low adhesion pattern when viewed in a plane.

According to some embodiments, the low adhesion pattern includes a fluorine-based compound.

According to some embodiments, the display element layer further includes a capping layer on or under the inorganic absorbing layer, and the capping layer overlaps the first and second light emitting elements and the light receiving element when viewed in a plane.

According to some embodiments, the display element layer further includes a capping layer between the inorganic absorbing layer and the first and second light emitting elements, and the capping layer does not overlap the light receiving element when viewed in a plane.

According to some embodiments, the inorganic absorbing layer includes a transition metal, a post-transition metal, a lanthanide metal, or an alloy of two or more metals selected from the transition metal, the post-transition metal, and the lanthanide metal.

According to some embodiments, the electronic device further includes an input sensing layer between the display element layer and the reflection control layer and a light blocking layer on the input sensing layer and provided with upper openings defined therethrough. The input sensing layer includes a first conductive layer on the display element layer, a second conductive layer on the first conductive layer, and a sensing insulating layer between the first conductive layer and the second conductive layer, and the upper openings overlap the first, second, and third openings, respectively.

Aspects of some embodiments of the inventive concept include an electronic device including a display element layer including a light emitting area, a transmission area, and a non-light-emitting area surrounding the light emitting area and the transmission area and a reflection control layer on the display element layer and including a dye. The display element layer includes a light emitting element in the light emitting area, a light receiving element in the transmission area, a low adhesion pattern on the light receiving element, and an inorganic absorbing layer on the light emitting element. The inorganic absorbing layer is provided with a transmission opening defined therethrough to overlap the low adhesion pattern when viewed in a plane.

According to some embodiments, the display element layer further includes a capping layer under the inorganic absorbing layer and overlapping the light emitting area and the transmission area, and the low adhesion pattern is on the capping layer.

According to some embodiments, the display element layer further includes a capping layer under the inorganic absorbing layer and provided with an opening defined therethrough to overlap the transmission area, and the low adhesion pattern is in the opening of the capping layer.

According to some embodiments, the display element layer further includes a capping layer on the inorganic absorbing layer and overlapping the light emitting area and the transmission area, and the capping layer covers the low adhesion pattern.

According to some embodiments, the reflection control layer is provided with an opening pattern defined therethrough, and the opening pattern overlaps the transmission opening when viewed in a plane.

According to the above, as the reflection control layer or the organic pattern, which is located on the light receiving element, absorbs a light in a specific wavelength region, noise from or caused by external light may be reduced, and the sensing reliability of the light receiving element is improved.

The inorganic absorbing layer and the reflection control layer, which are located on the light receiving element, are patterned, and thus, the transmittance with respect to the sensing light incident to the light receiving element and the sensitivity of the light receiving element are improved.

BRIEF DESCRIPTION OF THE DRAWINGS

The above and other characteristics of embodiments according to the present disclosure will become readily apparent by reference to the following detailed description when considered in conjunction with the accompanying drawings wherein:

FIGS. 6A and 6B are cross-sectional views of an electronic device according to some embodiments of the present disclosure;

DETAILED DESCRIPTION

Figure 1:
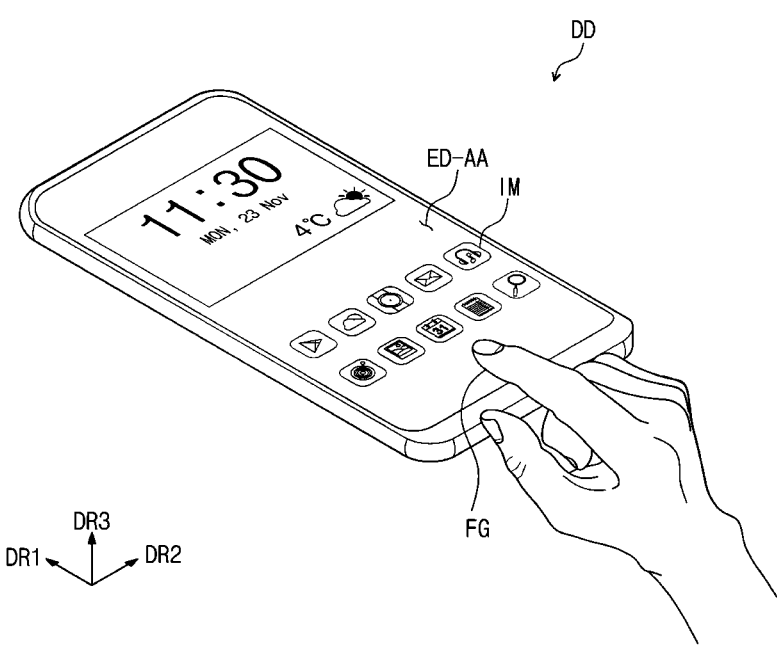
FIG. 1 is a perspective view of an electronic device according to some embodiments of the present disclosure.

Aspects of some embodiments of the present disclosure may be variously modified and realized in many different forms, and thus specific embodiments will be illustrated in the drawings and described in more detail hereinbelow. However, embodiments according to the present disclosure should not be limited to the specific disclosed forms, and be construed to include all modifications, equivalents, or replacements included in the spirit and scope of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an electronic device according to some embodiments of the present disclosure will be explained in more detail with reference to the accompanying drawings.

FIG. 1 is a perspective view of an electronic device DD according to some embodiments of the present disclosure.

Figure 2:
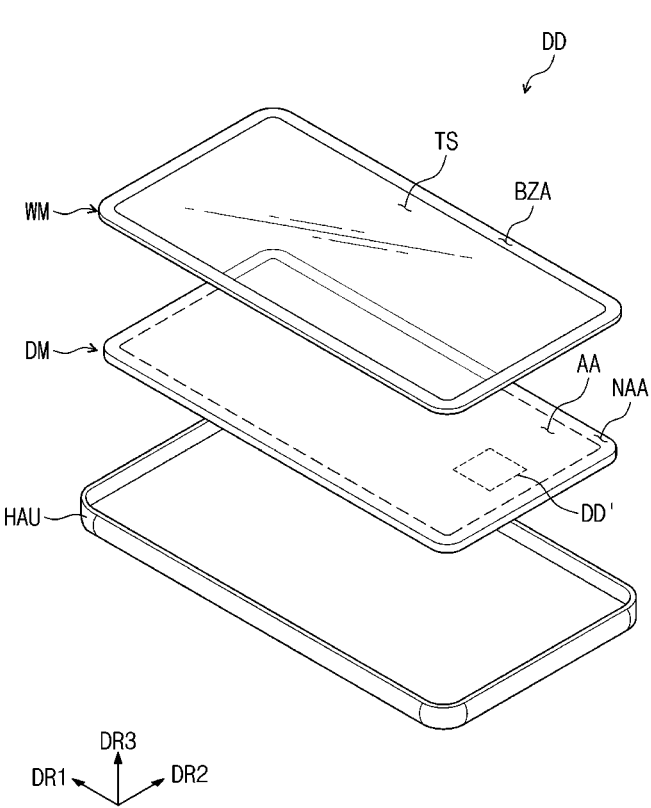
FIG. 2 is an exploded perspective view of an electronic device according to some embodiments of the present disclosure.
Figure 3:
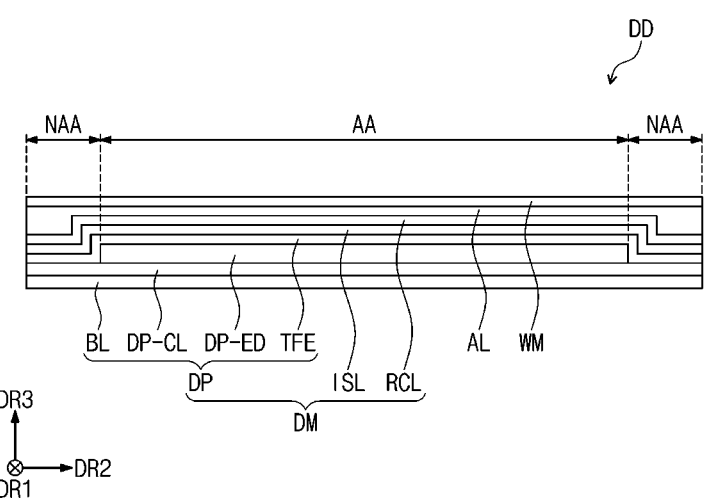
FIG. 3 is a cross-sectional view of an electronic device according to some embodiments of the present disclosure.

FIG. 2 is an exploded perspective view of the electronic device DD according to some embodiments of the present disclosure. FIG. 3 is a cross-sectional view of the electronic device DD according to some embodiments of the present disclosure.

The electronic device DD may be a device that is activated in response to electrical signals to display images. For example, the electronic device DD may be applied to a large-sized electronic item, such as a television set or an outdoor billboard, and a small and medium-sized electronic item, such as a monitor, a mobile phone, a tablet computer, a navigation unit, or a game unit. However, these are merely examples, and the electronic device DD may be applied to other electronic items as long as they do not depart from the inventive concept of the present disclosure. FIG. 1 shows the mobile phone as a representative example of the electronic device DD.

Referring to FIG. 1, the electronic device DD may have a rectangular shape with long sides in a first direction DR1 and short sides in a second direction DR2 crossing the first direction DR1. However, the shape of the electronic device DD should not be limited to the rectangular shape, and the electronic device DD may have a variety of shapes, such as a circular shape, a polygonal shape, etc.

According to some embodiments, the electronic device DD may be flexible. The term "flexible" used herein refers to the property of being able to be bent, and the flexible electronic device may include all structures from a structure that is completely bent to a structure that is bent at the scale of a few nanometers. For example, the flexible electronic device DD may be a curved device or a foldable device. According to some embodiments, the electronic device DD may be rigid.

The electronic device DD may display an image IM at a display area ED-AA. The display area ED-AA of the electronic device DD may be substantially parallel to a surface defined by the first direction DR1 and the second direction DR2. The electronic device DD may display the image IM toward a third direction DR3 substantially perpendicular to a plane defined by the first direction DR1 and the second direction DR2. Meanwhile, FIG. 1 shows a flat display area ED-AA, however, according to some embodiments, the display area ED-AA of the electronic device DD may have a curved shape bent from at least one side of the plane.

Front (or upper) and rear (or lower) surfaces of each member of the electronic device DD may be opposite to each other in the third direction DR3, and a normal line direction of each of the front and rear surfaces may be substantially parallel to the third direction DR3. A separation distance between the front and rear surfaces of each member (or each unit) in the third direction DR3 may correspond to a thickness in the member (or the unit) in the third direction DR3.

In the present disclosure, the expression "when viewed in a plane" or "in a plan view" may refer to a state of being viewed in the third direction DR3. In the present disclosure, the expression "on a cross-section" may mean a state of being viewed in the first direction DR1 or the second direction DR2. Meanwhile, directions indicated by the first, second, and third directions DR1, DR2, and DR3 are relative to each other, and thus, the directions indicated by the first, second, and third directions DR1, DR2, and DR3 may be changed to other directions.

According to some embodiments, the image IM provided from the electronic device DD may include a still image as well as a video. FIG. 1 shows a clock widget and application icons as a representative example of the image IM. A surface through which the image IM is displayed may correspond to a front surface of the electronic device DD and a front surface of a window WM (refer to FIG. 2).

According to some embodiments, the electronic device DD may sense an external input applied thereto from the outside. The external input may include a variety of external inputs provided from the outside. For example, the external input may include force, pressure, temperature, light, etc. The external input may include an external input (e.g., a hovering input) in proximity to or approaching close to the electronic device DD at a distance (e.g., a set or predetermined distance) as well as a touch input, e.g., a hand of a user or a pen.

According to some embodiments, the electronic device DD may sense the user input through the display area ED-AA defined in the front surface thereof and may respond the sensed input. However, the area of the electronic device DD in which the external input is sensed should not be limited to the front surface of the electronic device DD. The electronic device DD may sense the user input applied to a side or rear surface of the electronic device DD depending on its design, however, it should not be limited to a specific embodiment.

Referring to FIG. 2, the electronic device DD may include a window WM, a display module DM, and a housing HAU. The window WM may be coupled with the housing HAU to form an external appearance of the electronic device DD and may provide an inner spaced to accommodate components of the electronic device DD.

The window WM may be located on the display module DM. The window WM may have a shape corresponding to a shape of the display module DM. The window WM may cover a front surface of the display module DM and may protect the display module DM from external impacts and scratches.

The window WM may include an optically transparent insulating material. As an example, the window WM may include a glass substrate or a polymer substrate, and the window WM may include a tempered glass substrate. The window WM may have a single-layer or multi-layer structure. The window WM may further include functional layers, such as an anti-fingerprint layer, a phase control layer, a hard coating layer, etc., located on an optically transparent substrate.

The front surface of the window WM may correspond to the front surface of the electronic device DD. The front surface of the window WM may include a transparent area TS and a bezel area BZA.

The transparent area TS of the window WM may be an optically transparent area. The window WM may transmit the image IM provided from the display module DM through the transparent area TS, and the user may view the image IM. The transparent area TS of the window WM may correspond to the display area ED-AA of the electronic device DD.

The bezel area BZA of the window WM may be obtained by printing a material having a color (e.g., a set or predetermined color) on an area of the window WM. The bezel area BZA of the window WM may prevent or reduce external visibility of components of the display module DM, which are arranged to overlap the bezel area BZA.

The bezel area BZA may be defined adjacent to the transparent area TS, and the shape of the transparent area TS may be defined by the bezel area BZA. As an example, the bezel area BZA may be arranged outside the transparent area TS and may surround the transparent area TS, however, it should not be limited thereto or thereby. The bezel area BZA may be defined to be adjacent to only one side of the transparent area TS or may be omitted. In addition, the bezel area BZA may be defined at a side surface of the electronic device DD rather than the front surface of the electronic device DD.

The display module DM may be arranged between the window WM and the housing HAU. The display module DM may display images in response to electrical signals and may transmit/receive information about the external input. The display module DM may include an active area AA and a peripheral area NAA.

The active area AA may be activated in response to electrical signals. The images may be displayed through the active area AA, and the external input may be sensed in the active area AA. According to some embodiments, the active area AA of the display module DM may correspond to the above-described transparent area TS. In the present disclosure, the expression "an area/portion corresponds to another area/portion" may mean that "an area/portion overlaps another area/portion", and the expression should not be limited to describing a case that "an area/portion has the same size and/or the same shape as those of another area/portion".

The peripheral area NAA may be defined adjacent to the active area AA. As an example, the peripheral area NAA may surround the active area AA, however, it should not be limited thereto or thereby. According to some embodiments, the peripheral area NAA may be defined in a variety of shapes. A driving circuit or a driving line to drive the active area AA, various signal lines to provide electrical signals, and pads may be located in the peripheral area NAA. The peripheral area NAA of the display module DM may correspond to the bezel area BZA. Components of the display module DM, which are located in the peripheral area NAA, may be prevented from being viewed from the outside by the bezel area BZA.

The housing HAU may be located under the display module DM and may accommodate the display module DM. The housing HAU may absorb impacts applied thereto from the outside and may prevent or reduce instances and quantities of foreign substances and moisture entering the display module DM, and thus, the display module DM may be protected by the housing HAU. According to some embodiments, the housing HAU may be provided in a form obtained by coupling a plurality of accommodating members.

The electronic device DD may further include an electronic module including a variety of functional modules to drive the display module DM, a power supply module supplying a power required for an overall operation of the electronic device DD, and a bracket coupled to the display module DM and/or the housing HAU to divide an inner space of the electronic device DD.

Referring to FIG. 3, the display module DM may include a display panel DP, an input sensing layer ISL, and a reflection control layer RCL. The display panel DP may include a base layer BL, a circuit element layer DP-CL, a display element layer DP-ED, and an encapsulation layer TFE.

The display panel DP according to various embodiments may be a light-emitting type display panel, however, embodiments according to the present disclosure are not limited thereto. For instance, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot or a quantum rod. Hereinafter, the organic light emitting display panel will be described as a representative example of the display panel DP.

The base layer BL may provide a base surface on which the circuit element layer DP-CL is located. The base layer BL may be a glass substrate, a metal substrate, a polymer substrate, or an organic/inorganic composite material substrate.

The circuit element layer DP-CL may be located on the base layer BL. The circuit element layer DP-CL may include at least one insulating layer, a circuit element, signal lines, and signal pads. The circuit element layer DP-CL may include a pixel driving circuit included in each of pixels to display images and a sensor driving circuit included in each of sensors to sense external information. As an example, the sensor may be an optical sensor that senses biometric information using an optical method.

The display element layer DP-ED may be located on the circuit element layer DP-CL. The display element layer DP-ED may include light emitting elements arranged to overlap the active area AA. The light emitting elements of the display element layer DP-ED may be connected to the circuit element of the circuit element layer DP-CL to form the pixels. Each of the pixels may emit light in response to a corresponding driving signal through the active area AA.

The display element layer DP-ED may include light receiving elements arranged to overlap the active area AA. Each of the light receiving elements may be an optical sensor that senses a light incident thereto and converts an optical signal to an electrical signal. As an example, the light receiving element may be a photodiode.

Configurations of the display element layer DP-ED will be described in detail later with reference to figures.

The encapsulation layer TFE may be located on the display element layer DP-ED and may encapsulate the display element layer DP-ED. The encapsulation layer TFE may include a plurality of thin layers. The thin layers of the encapsulation layer TFE may be provided to improve an optical efficiency of the light emitting elements of the display element layer DP-ED or to protect the light emitting elements.

The input sensing layer ISL may be located on the display panel DP. The input sensing layer ISL may be located directly on the display panel DP. In the present disclosure, a structure in which one layer, component, member, or the like is formed on another layer, component, member, or the like through successive processes without using a separate adhesive layer or adhesive member will be referred to as being "directly arranged" or "directly located". The expression "the input sensing layer ISL is located directly on the display panel DP" means that the input sensing layer ISP is formed on a base surface of the display panel DP through successive processes without a separate adhesive layer after the display panel DP is formed.

According to some embodiments, the input sensing layer ISL may be coupled with the display panel DP by an adhesive layer. The input sensing layer ISL may be fixed to an upper surface of the display panel DP by the adhesive layer after being formed through a separate process from the display panel DP.

The input sensing layer ISL may sense the external input applied thereto from the outside and may obtain coordinate information of the external input. The input sensing layer ISL may be driven in various ways, such as a capacitive method, a resistive method, an infrared ray method, a sonic method, or a pressure method, or the like, however, it should not be particularly limited. As an example, the input sensing layer ISL may be driven in the capacitive method and may include a plurality of sensing electrodes to sense the external input. The input sensing layer ISL may provide an input signal corresponding to the external input to the display panel DP, and the display panel DP may generate an image corresponding to the input signal.

The reflection control layer RCL may be located on the input sensing layer ISL. The reflection control layer RCL may be located directly on the input sensing layer ISL. That is, the reflection control layer RCL may be formed by coating or printing a composition of the reflection control layer RCL on a base surface provided by the input sensing layer ISL.

The reflection control layer RCL may reduce a reflectance with respect to the external light from the outside. In addition, the reflection control layer RCL may reduce a reflected light reflected by metal layers included in the display panel DP together with an inorganic absorbing layer IAP (refer to FIG. 6A) included in the display element layer DP-ED. Detailed descriptions of the reflection control layer RCL will be described in more detail later.

The electronic device DD may further include an adhesive layer AL located between the display module DM and the window WM. The display module DM and the window WM may be coupled to each other with the adhesive layer AL interposed therebetween. The adhesive layer AL may include a transparent adhesive, such as an optically clear adhesive (OCA) film, an optically clear resin (OCR), or a pressure sensitive adhesive (PSA) film. However, the adhesive included in the adhesive layer AL should not be limited thereto or thereby.

Figure 4:
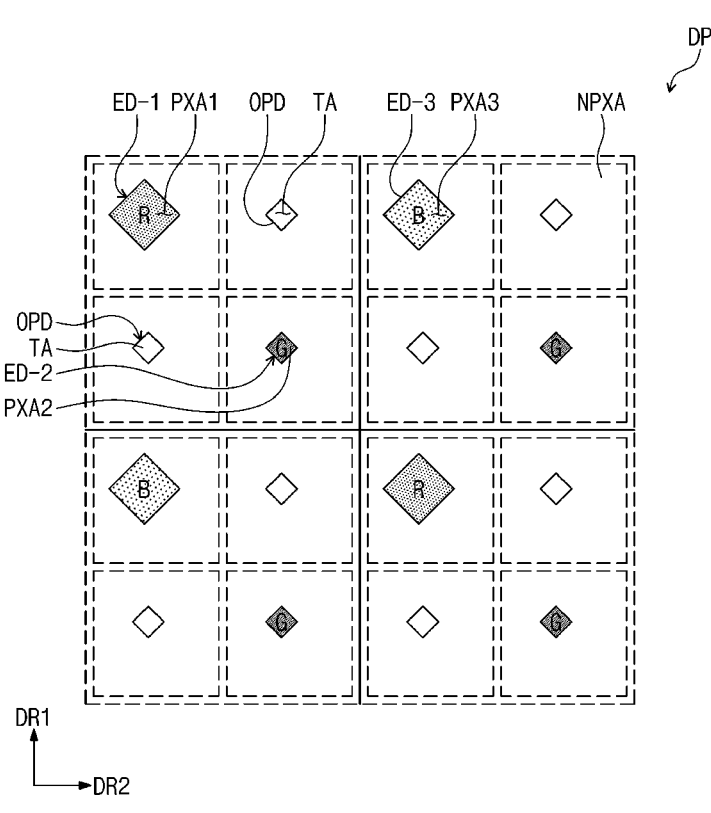
FIG. 4 is an enlarged plan view of a display panel corresponding to an area DD' of FIG. 2 according to some embodiments of the present disclosure.

FIG. 4 is an enlarged plan view of a display panel corresponding to an area DD' of FIG. 2.

Referring to FIG. 4, the display panel DP may include a plurality of light emitting elements ED-1, ED-2, and ED-3 and a plurality of light receiving elements OPD. The light emitting elements ED-1, ED-2, and ED-3 may include a first light emitting element ED-1 emitting a first color, a second light emitting element ED-2 emitting a second color, and a third light emitting element ED-3 emitting a third color.

The active area AA of the display panel DP may be divided into a plurality of light emitting areas PXA1, PXA2, and PXA3, a plurality of transmission areas TA, and a non-light-emitting area NPXA.

The light emitting elements ED-1, ED-2, and ED-3 may be respectively located in the light emitting areas PXA1, PXA2, and PXA3 and may emit lights. The light emitting areas PXA1, PXA2, and PXA3 may include a first light emitting area PXA1 in which the first light emitting element ED-1 is located, a second light emitting area PXA2 in which the second light emitting element ED-2 is located, and a third light emitting area PXA3 in which the third light emitting element ED-3 is located. As an example, the first light emitting element ED-1 may emit a red light through the first light emitting area PXA1, the second light emitting element ED-2 may emit a green light through the second light emitting area PXA2, and the third light emitting element ED-3 may emit a blue light through the third light emitting area PXA3. However, colors of the lights emitted from the light emitting elements ED-1, ED-2, and ED-3 should not be limited thereto or thereby.

The light receiving elements OPD may be respectively located in the transmission areas TA. The light receiving elements OPD may receive and sense a light reflected by an external object and incident thereto through the transmission areas TA.

The non-light-emitting area NPXA may be defined between the light emitting areas PXA1, PXA2, and PXA3 and the transmission areas TA. The non-light-emitting area NPXA may surround the light emitting areas PXA1, PXA2, and PXA3 and the transmission areas TA.

Referring to FIG. 4, the first light emitting element ED-1 and the third light emitting element ED-3 may be alternately arranged with each other in the first direction DR1 and the second direction DR2. FIG. 4 shows a structure in which the first light emitting element ED-1 and the third light emitting element ED-3 are alternately arranged in the first direction DR1 and the second direction DR2 as a representative example, however, according to some embodiments, the first light emitting element ED-1 and the third light emitting element ED-3 may be alternately arranged in one direction of the first direction DR1 and the second direction DR2. As an example, the first light emitting elements ED-1 may be arranged in different columns or different rows from third light emitting elements ED-3.

The second light emitting elements ED-2 may be arranged in the first direction DR1 and the second direction DR2. The second light emitting elements ED-2 may be alternately arranged with the first light emitting elements ED-1 along a diagonal direction crossing each of the first direction DR1 and the second direction DR2 when viewed in a plane. In addition, the second light emitting elements ED-2 may be alternately arranged with the third light emitting elements ED-3 along a diagonal direction crossing each of the first direction DR1 and the second direction DR2.

The light receiving elements OPD may be located between the first light emitting element ED-1 and the third light emitting element ED-3 in the first direction DR1 and the second direction DR2. The light receiving elements OPD may be alternately arranged with the second light emitting elements ED-2 in the first direction DR1 and the second direction DR2. The light receiving elements OPD may be arranged along a diagonal direction crossing each of the first direction DR1 and the second direction DR2.

The light emitting areas emitting lights in different wavelength ranges among the light emitting areas PXA1, PXA2, and PXA3 may have different sizes from each other, however, they should not be limited thereto or thereby. The light emitting areas emitting lights in different wavelength ranges may have substantially the same size as each other. According to some embodiments, the first light emitting area PXA1 may have a size greater than a size of the second light emitting area PXA2 and may have a size substantially equal to or smaller than a size of the third light emitting area PXA3. A size ratio of the light emitting areas PXA1, PXA2, and PXA3 should not be limited to a size ratio shown in FIG. 4 and may be changed in various ways.

Each of the light emitting areas PXA1, PXA2, and PXA3 may have a quadrangular shape when viewed in a plane, however, it should not be limited thereto or thereby. According to some embodiments, each of the light emitting areas PXA1, PXA2, and PXA3 may have a variety of shapes, such as a polygonal shape, a circular shape, an oval shape, etc., when viewed in the plane. In FIG. 4, the first, second, and third light emitting areas PXA1, PXA2, and PXA3 have the quadrangular shape when viewed in the plane, however, they should not be limited thereto or thereby. According to some embodiments, two or more areas of the light emitting areas PXA1, PXA2, and PXA3 may have different shapes from each other. As an example, the first and third light emitting areas PXA1 and PXA3 may have the quadrangular shape, and the second light emitting area PXA2 may have the circular shape.

The transmission area TA may have a size smaller than the size of the first light emitting area PXA1 and the size of the third light emitting area PXA3. The size of the transmission area TA may be substantially the same as or smaller than the size of the second light emitting area PXA2. The size of the transmission area TA should not be limited thereto or thereby.

The transmission area TA may have a quadrangular shape when viewed in a plane, however, it should not be limited thereto or thereby. According to some embodiments, the transmission area TA may have a variety of shapes, such as a polygonal shape, a circular shape, an oval shape, etc., when viewed in the plane.

Meanwhile, the arrangement of the light emitting elements ED-1, ED-2, and ED-3 and the light receiving elements OPD, the shape and the size ratio of the light emitting areas PXA1, PXA2, and PXA3 and the transmission areas TA shown in FIG. 4 are merely examples, and they may be changed depending on a design of the display panel DP and should not be particularly limited.

Figure 5:
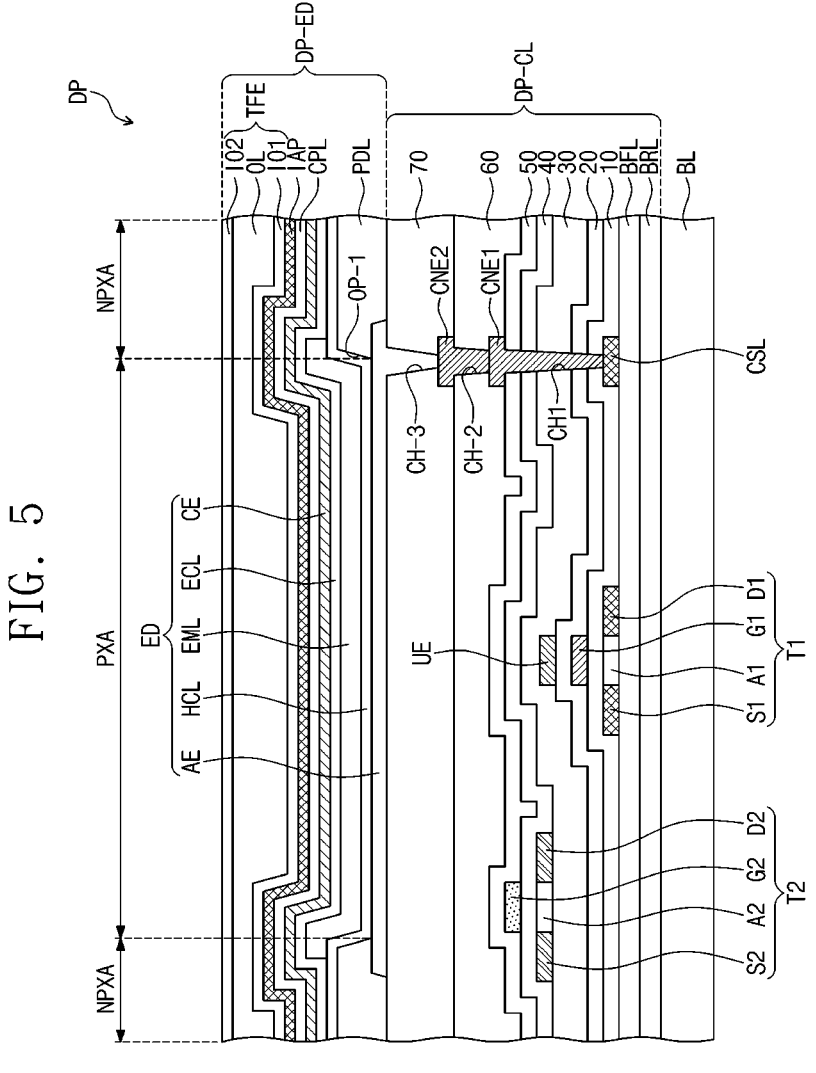
FIG. 5 is a cross-sectional view of a display panel according to some embodiments of the present disclosure.

FIG. 5 is a cross-sectional view of the display panel DP according to some embodiments of the present disclosure. FIG. 5 shows a cross-section of a light emitting element ED, a first transistor T1, a second transistor T2, and a connection signal line CSL, which correspond to one pixel, as a representative example.

The base layer BL may include a glass substrate, a metal substrate, a polymer substrate, or an organic/inorganic composite material substrate. The base layer BL may include a synthetic resin layer. As an example, the synthetic resin layer included in the base layer BL may include at least one of an acrylic-based resin, a methacrylic-based resin, a polyiso-prene-based resin, a vinyl-based resin, an epoxy-based resin, a urethane-based resin, a cellulose-based resin, a siloxane-based resin, a polyamide-based resin, a perylene-based resin, or a polyimide-based resin. However, a material for the base layer BL should not be limited thereto or thereby.

At least one inorganic layer may be located on an upper surface of the base layer BL. The inorganic layer may include at least one of aluminum oxide, titanium oxide, silicon oxide, silicon nitride, silicon oxynitride, zirconium oxide, or hafnium oxide. The inorganic layer may be formed in multiple layers. The inorganic layers may form a barrier layer BRL and a buffer layer BFL. According to some embodiments, the buffer layer BFL and the barrier layer BRL may be selectively located on the base layer BL.

The barrier layer BRL may be located on the base layer BL. The barrier layer BRL may prevent or reduce instances of a foreign substance entering from the outside. The barrier layer BRL may include a silicon oxide layer and a silicon nitride layer. According to some embodiments, the barrier layer BRL may include silicon oxide layers alternately stacked with silicon nitride layers.

The buffer layer BFL may be located on the barrier layer BRL. The buffer layer BFL may increase a coupling force between the base layer BL and a semiconductor pattern or between the base layer BL and a conductive pattern. According to some embodiments, the buffer layer BFL may include a silicon oxide layer and a silicon nitride layer.

The circuit element layer DP-CL may include the semiconductor pattern, the conductive pattern, and at least one insulating layer. An insulating layer, a semiconductor layer, and a conductive layer may be formed by a coating or depositing process during a manufacturing process of the display panel DP. Then, the insulating layer, the semiconductor layer, and the conductive layer may be selectively patterned through several photolithography processes. After the processes are completed, the semiconductor pattern and the conductive pattern included in the DP-CL may be formed on the base layer BL.

FIG. 5 shows the circuit element layer DP-CL including a first semiconductor pattern and a second semiconductor pattern, which are located on different layers, as a representative example. However, a cross-section of driving elements included in the circuit element layer DP-CL of the present disclosure should not be limited thereto or thereby. According to some embodiments, the cross-section of the driving elements may be changed depending on a structure of the driving circuit that drives the pixel. As an example, transistors included in the circuit element layer DP-CL may be formed on the same layer through a low temperature polycrystalline silicon (LTPS) process or a low temperature polycrystalline oxide (LTPO) process. Hereinafter, the circuit element layer DP-CL shown in FIG. 5 will be described as a representative example.

The first semiconductor pattern of the circuit element layer DP-CL may be located on the buffer layer BFL. The first semiconductor pattern may include a silicon semiconductor. The first semiconductor pattern may include poly-silicon, however, embodiments according to the present disclosure are not limited thereto or thereby. For example, according to some embodiments, the first semiconductor pattern may include amorphous silicon.

The first semiconductor pattern may have different electrical properties depending on whether or not it is doped or whether it is doped with an N-type dopant or a P-type dopant. The first semiconductor pattern may include a first region with a high conductivity and a second region with a low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as a source electrode and a drain electrode of the transistor. The second region may substantially correspond to an active (or a channel) of the transistor.

Referring to FIG. 5, a first source electrode S1, a first active A1, and a first drain electrode D1 of the first transistor T1 may be formed from the first semiconductor pattern. The first source electrode S1 and the first drain electrode D1 may be spaced apart from each other with the first active A1 interposed therebetween.

The connection signal line CSL may be located on the buffer layer BFL. The connection signal line CSL may extend from the semiconductor pattern. The connection signal line CSL may be electrically connected to the first transistor T1 when viewed in a plane.

The circuit element layer DP-CL may include a plurality of insulating layers located on the base layer BL. FIG. 5 shows first, second, third, fourth, fifth, sixth, and seventh insulating layers 10 to 70 as an example of the insulating layers. However, the number of the insulating layers should not be limited thereto or thereby and may be changed depending on a stack process or a configuration of the circuit element layer DP-CL.

Each of the first to seventh insulating layers 10 to 70 may be an inorganic layer and/or an organic layer and may have a single-layer or multi-layer structure. The inorganic layer may include at least one of aluminum oxide, titanium oxide, silicon oxide, silicon nitride, silicon oxynitride, zirconium oxide, or hafnium oxide, however, a material for the inorganic layer is not limited thereto or thereby.

The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, or a perylene-based resin, however, embodiments according to the present disclosure are not limited thereto or thereby.

The first insulating layer 10 may commonly overlap with the pixels and may cover the first semiconductor pattern and the connection signal line CSL. A first gate electrode G1 of the first transistor T1 may be located on the first insulating layer 10. The first gate electrode G1 of the first transistor T1 may overlap the first active A1. The first gate electrode G1 may act as a mask in a doping process of the semiconductor pattern.

The second insulating layer 20 may be located on the first insulating layer 10 to cover the first gate electrode G1. An upper electrode UE may be located on the second insulating layer 20. The upper electrode UE may be a portion of a metal pattern or a portion of the doped semiconductor pattern. A portion of the first gate electrode G1 and the upper electrode UE overlapping the portion of the first gate electrode G1 may define a capacitor of the pixel. According to some embodiments, the upper electrode UE may be omitted.

The third insulating layer 30 may be located on the second insulating layer 20 to cover the upper electrode UE. The second semiconductor pattern may be located on the third insulating layer 30. The second semiconductor pattern may include oxide semiconductor containing metal oxide. The oxide semiconductor may include a crystalline or amorphous oxide semiconductor.

As an example, the oxide semiconductor may include the metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

The second semiconductor pattern may include a plurality of areas distinguished from each other depending on whether the metal oxide is reduced. An area (hereinafter, referred to as a reduced area) where the metal oxide is reduced may have a conductivity higher than that of an area (hereinafter, referred to as a non-reduced area) where the metal oxide is not reduced. The reducing area may substantially act as the source electrode or the drain electrode of the transistor. The non-reduced area may substantially correspond to the active or channel of the transistor.

Referring to FIG. 5, a second source electrode S2, a second active A2, and a second drain electrode D2 of the second transistor T2 may be formed from the second semiconductor pattern. The second source electrode S2 and the second drain electrode D2 may be spaced apart from each other with the second active A2 interposed therebetween.

The fourth insulating layer 40 may be located on the third insulating layer 30 to cover the second semiconductor pattern. A second gate electrode G2 of the second transistor T2 may be located on the fourth insulating layer 40. The second gate electrode G2 may overlap the second active A2.

The fifth insulating layer 50 may be located on the fourth insulating layer 40 to cover the second gate electrode G2. The sixth insulating layer 60 may be located on the fifth insulating layer 50.

A first connection electrode CNE1 may be located on the fifth insulating layer 50. A second connection electrode CNE2 may be located on the sixth insulating layer 60. The first connection electrode CNE1 may be connected to the connection signal line CSL via a first contact hole CH1 defined through the first to fifth insulating layers 10 to 50. The second connection electrode CNE2 may be connected to the first connection electrode CNE1 via a second contact hole CH2 defined through the sixth insulating layer 60. According to some embodiments, at least one of the fifth insulating layer 50 or the sixth insulating layer 60 may be omitted.

The display element layer DP-ED may be located on the circuit element layer DP-CL. The display element layer DP-ED may include the light emitting element ED and a pixel definition layer PDL. For example, the light emitting element ED may include an organic light emitting element, a quantum dot light emitting element, a micro-LED light emitting element, or a nano-LED light emitting element, however, it should not be limited thereto or thereby. According to some embodiments, the light emitting element ED may include various embodiments as long as a light may be generated or an amount of the light may be controlled according to an electrical signal.

According to some embodiments, the light emitting element ED may include a pixel electrode AE, a common electrode CE, a hole control layer HCL, an electron control layer ECL, and a light emitting layer EML. The pixel electrode AE may be located on the seventh insulating layer 70. The pixel electrode AE may be connected to the second connection electrode CNE2 via a third contact hole CH3 defined through the seventh insulating layer 70.

The pixel definition layer PDL may be located on the pixel electrode AE and the seventh insulating layer 70 and may expose a portion of the pixel electrode AE. A first opening OP-1 may be defined through the pixel definition layer PDL to expose at least a portion of the pixel electrode AE. According to some embodiments, the portion of the pixel electrode AE exposed through the opening OP-1 may correspond to a light emitting area PXA. A non-light-emitting area NPXA may be defined adjacent to the light emitting area PXA and may surround the light emitting area PXA.

The pixel definition layer PDL may be formed of a polymer resin. As an example, the pixel definition layer PDL may include a polyacrylate-based resin or a polyimide-based resin. The pixel definition layer PDL may further include an inorganic material in addition to the polymer resin. According to some embodiments, the pixel definition layer PDL may include an inorganic material. As an example, the pixel definition layer PDL may include silicon nitride ($SiN_x$), silicon oxide ($SiO_x$), or silicon oxynitride ($SiO_xN_y$).

Meanwhile, the pixel definition layer PDL may include a light absorbing material. The pixel definition layer PDL may include a black coloring agent. The black coloring agent may include a black pigment or a black dye. The black coloring agent may include a metal material, such as carbon black, chrome, etc., or an oxide thereof.

The light emitting layer EML may be located on the pixel electrode AE. The light emitting layer EML may be located in an area corresponding to the first opening OP-1 of the pixel definition layer PDL. The light emitting layer EML may include an organic light emitting material and/or an inorganic light emitting material. As an example, the light emitting layer EML may include fluorescent or phosphorescent material, an organometallic complex light emitting material, or a quantum dot. The light emitting layer EML may emit a light having one of red, green, and blue colors.

Meanwhile, the light emitting element ED may further include an auxiliary light emitting layer located on the light emitting layer EML. The auxiliary light emitting layer may have a thickness changed depending on a wavelength of the light emitted from the light emitting layer EML. As the auxiliary light emitting layer is provided, a resonant distance may be controlled in the light emitting element ED. In addition, as the auxiliary light emitting layer is provided, a color purity of the light emitted from the light emitting layer EML may be improved.

The hole control layer HCL may be located between the pixel electrode AE and the light emitting layer EML. The electron control layer ECL may be located between the light emitting layer EML and the common electrode CE. The hole control layer HCL and the electron control layer ECL may be commonly arranged over the pixels. The hole control layer HCL and the electron control layer ECL may overlap the light emitting area PXA and the non-light-emitting area NPXA and may be formed as a common layer. The hole control layer HCL and the electron control layer ECL may be provided using an open mask.

The hole control layer HCL may include at least one of a hole injection layer or a hole transport layer, which are located between the pixel electrode AE and the light emitting layer EML. The electron control layer ECL may include an electron transport layer and an electron injection layer, which are located between the light emitting layer EML and the common electrode CE.

The hole injection layer and the hole transport layer may include a phthalocyanine compound such as copper phthalocyanine, DNTPD($N^1,N^{1'}$-([1,1'-biphenyl]-4,4'-diyl)bis($N^1$-phenyl-$N^4,N^4$-di-m-tolylbenzene-1,4-diamine)), m-MTDATA(4,4',4''-[tris(3-methylphenyl)phenylamino]triphenylamine), TDATA(4,4'4''-Tris(N,N-diphenylamino)triphenylamine), 2-TNATA(4,4',4''-tris[N-(2-naphthyl)-N-phenylamino]-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS (Polyaniline/Poly(4-styrenesulfonate)), NPB(N,N'-di (naphthalene-1-yl)-N,N'-diphenyl-benzidine), triphenylamine-containing poly(ether ketone) (TPAPEK), 4-Isopropyl-4'-methyldiphenyliodonium [Tetrakis(pentafluorophenyl)borate], HATCN(dipyrazino[2,3-f: 2',3'-h] quinoxaline-2,3,6,7,10,11-hexacarbonitrile), etc.

The hole injection layer and the hole transport layer may include carbazole-based derivatives, e.g., n-phenyl carbazole, polyvinyl carbazole, etc., fluorene-based derivatives, triphenylamine-based derivatives, e.g., TPD(N,N'-bis(3-methylphenyl)-N,N'-diphenyl-[1,1'-biphenyl]-4,4'-diamine), TCTA(4,4',4''-tris(N-carbazolyl)triphenylamine), etc., NPB(N,N'-di(naphthalene-1-yl)-N,N'-diphenyl-benzidine), TAPC(4,4'-Cyclohexylidene bis[N,N-bis(4-methylphenyl)benzenamine]), HMTPD(4,4'-Bis[N,N'-(3-tolyl)amino]-3,3'-dimethylbiphenyl), mCP(1,3-Bis(N-carbazolyl) benzene), etc.

The electron transport layer may include an anthracene-based compound, however, embodiments according to the present disclosure are not limited thereto or thereby. The electron transport layer may include, for example, $Alq_3$(Tris (8-hydroxyquinolinato)aluminum), 1,3,5-tri[(3-pyridyl)-phen-3-yl]benzene, 2,4,6-tris(3'-(pyridin-3-yl)biphenyl-3- yl)-1,3,5-triazine, 2-(4-(N-phenylbenzoimidazol-1-yl) phenyl)-9,10-dinaphthylanthracene, TPBi(1,3,5-Tri(1-phenyl-1H-benzo[d]imidazol yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), $Bebq_2$(berylliumbis (benzoquinolin-10-olate)), ADN(9,10-di(naphthalene-2-yl) anthracene), BmPyPhB(1,3-Bis[3,5-di(pyridin-3-yl)phenyl] benzene), TSPO1(diphenyl(4-(triphenylsilyl)phenyl) phosphine oxide), and mixtures thereof.

The electron injection layer may include a metal halide, such as LiF, NaCl, CsF, RbCl, RbI, CuI, KI, etc., a lanthanum group metal, such as Yb, or a co-deposition material of the metal halide and the lanthanum group metal. For example, the electron injection layer may include KI:Yb or RbI:Yb as the co-deposition material. Meanwhile, the electron injection layer may include a metal oxide, such as $Li_2O$ or BaO, or Liq(8-hydroxyl-Lithium quinolate), however, the embodiments according to the present disclosure are not limited thereto or thereby. The electron injection layer may include a mixture of an electron transport material and an insulating organo-metallic salt. The organo-metallic salt may be a material with an energy band gap of about 4 eV or more. In detail, the organo-metallic salt may include, for example, metal acetate, metal benzoate, metal acetoacetate, metal acetylacetonate, or metal stearate.

Meanwhile, materials included in the hole control layer HCL and the electron control layer ECL should not be limited thereto or thereby.

The common electrode CE may be located on the light emitting layer EML. The common electrode CE may be commonly arranged over the pixels. The common electrode CE may overlap the light emitting area PXA and the non-light-emitting area NPXA and may be provided as a common layer. The common electrode CE may be provided using an open mask.

Each of the pixel electrode AE and the common electrode CE may include at least one selected from, two or more compounds selected from, two or more mixtures selected from, or oxide of Ag, Mg, Cu, Al, Pt, Pd, Au, Ni, Nd, Ir, Cr, Li, Ca, LiF, Mo, Ti, W, In, Sn, and Zn.

Each of the pixel electrode AE and the common electrode CE may be a transmissive electrode, a transflective electrode, or a reflective electrode. The transmissive electrode may include a transparent metal oxide, e.g., indium tin oxide (ITO), indium zinc oxide (IZO), zinc oxide (ZnO), indium tin zinc oxide (ITZO), etc. The transflective electrode or the reflective electrode may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, Yb, W, a compound thereof, or a mixture thereof, e.g., AgMg, AgYb, or MgYb.

The pixel electrode AE and the common electrode CE may have a multi-layer structure of the reflective layer or the semi-transmissive layer, which is formed of the above-mentioned material, and the transparent conductive layer formed of indium tin oxide (ITO), indium zinc oxide (IZO), zinc oxide (ZnO), or indium tin zinc oxide (ITZO). As an example, the pixel electrode AE and the common electrode CE may have a three-layer structure of ITO/Ag/ITO, however, it should not be limited thereto or thereby.

When a first voltage and a second voltage are respectively applied to the pixel electrode AE and the common electrode CE, holes and electrons, which are injected into the light emitting layer EML, may be recombined with each other to generate excitons. The light emitting element ED may emit the light when the excitons return to a ground state from an excited state. Accordingly, the display panel DP may display the images through the active area AA (refer to FIG. 2).

The display element layer DP-ED may include a capping layer CPL and the inorganic absorbing layer IAP, which are located above the common electrode CE. The capping layer CPL may be located on the common electrode CE, and the inorganic absorbing layer IAP may be located on the capping layer CPL, however, they should not be limited thereto or thereby. According to some embodiments, the inorganic absorbing layer IAP may be located on the common electrode CE, and the capping layer CPL may be located on the inorganic absorbing layer IAP.

The capping layer CPL may have a single layer or multi-layer structure. The capping layer CPL may include an organic layer or an inorganic layer. As an example, the inorganic layer included in the capping layer CPL may include an alkali metal compound, such as LiF, an alkaline earth metal compound, such as $MgF_2$, SiON, SiNx, SiOy, or the like. The organic layer included in the capping layer CPL may include α-NPD, NPB, TPD, m-MTDATA, $Alq_3$, CuPc, TPD15(N4,N4,N4',N4'-tetra (biphenyl-4-yl) biphenyl-4,4'-diamine), TCTA(4,4',4"-Tris (carbazol-9-yl) triphenylamine), or the like, or may include an epoxy resin or an acrylate, such as methacrylate, however, it should not be limited thereto or thereby.

The inorganic absorbing layer IAP may include one metal material or an alloy of a plurality of metal materials. The inorganic absorbing layer IAP may include a transition metal, a post-transition metal, a lanthanide metal, or an alloy of two or more metals selected from the transition metal, the post-transition metal, and the lanthanide metal. As an example, the inorganic absorbing layer IAP may include bismuth (Bi), an alloy containing Bi, ytterbium (Yb), an alloy containing Yb, a compound $(Yb_xBi_y)$ of Yb and Bi, manganese (Mn), or an alloy containing Mn.

The capping layer CPL and the inorganic absorbing layer IAP may be commonly arranged over the pixels. The capping layer CPL and the inorganic absorbing layer IAP may overlap the light emitting area PXA and the non-light-emitting area NPXA and may be provided as a common layer.

The inorganic absorbing layer IAP may be deposited on the capping layer CPL and may have a thickness (e.g., a set or predetermined thickness). As an example, the inorganic absorbing layer IAP may have a thickness from about 50 Å to about 150 Å. However, the thickness of the inorganic absorbing layer IAP should not be limited thereto or thereby.

The capping layer CPL may control a phase difference between the common electrode CE and the inorganic absorbing layer IAP and may prevent or reduce interference of light due to the phase difference occurring. The inorganic absorbing layer IAP may cause a destructive interference of the light using thicknesses and materials of stacked layers, and thus, may reduce the reflectance with respect to the external light. The inorganic absorbing layer IAP may reduce a reflected light generated by the common electrode CE included in the display element layer DP-ED or other metal layers. The inorganic absorbing layer IAP may cause the destructive interfere between the reflected light, which is reflected by the common electrode CE and travels upward to the encapsulation layer TFE, and the reflected light, which is reflected by the inorganic absorbing layer IAP and travels upward to the encapsulation layer TFE, and thus, low reflection characteristics of the display panel DP may be implemented.

The encapsulation layer TFE may be located on the light emitting element ED. The encapsulation layer TFE may include an inorganic layer or an organic layer. As shown in FIG. 5, the encapsulation layer TFE may include first and second inorganic layers IO1 and IO2 and an organic layer OL located between the inorganic layers IO1 and IO2.

The first and second inorganic layers IO1 and IO2 may protect the pixels from moisture and/or oxygen. The first and second inorganic layers IO1 and IO2 may include at least one of aluminum oxide, titanium oxide, silicon oxide, silicon nitride, silicon oxynitride, zirconium oxide, or hafnium oxide, however, a material for the inorganic layers IO1 and IO2 should not be limited thereto or thereby.

The organic layer OL may protect the pixel from a foreign substance such as dust particles. The organic layer OL may include an acrylic-based resin, however, a material for the organic layer OL should not be particularly limited.

Figure 6A:
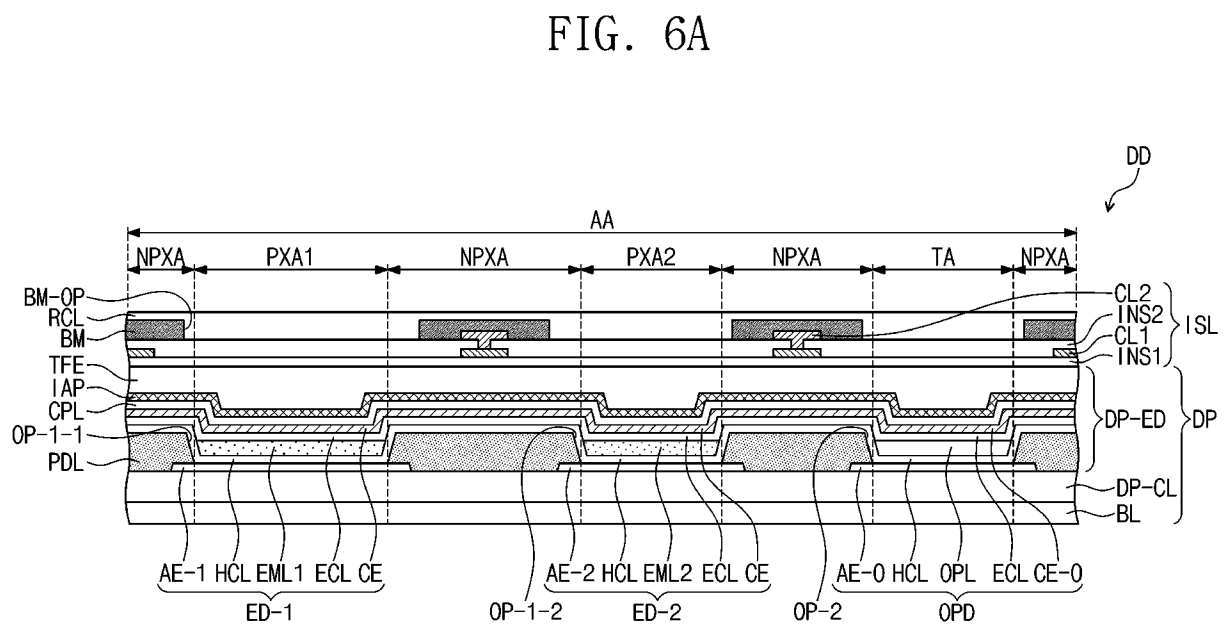
Figure 6B:
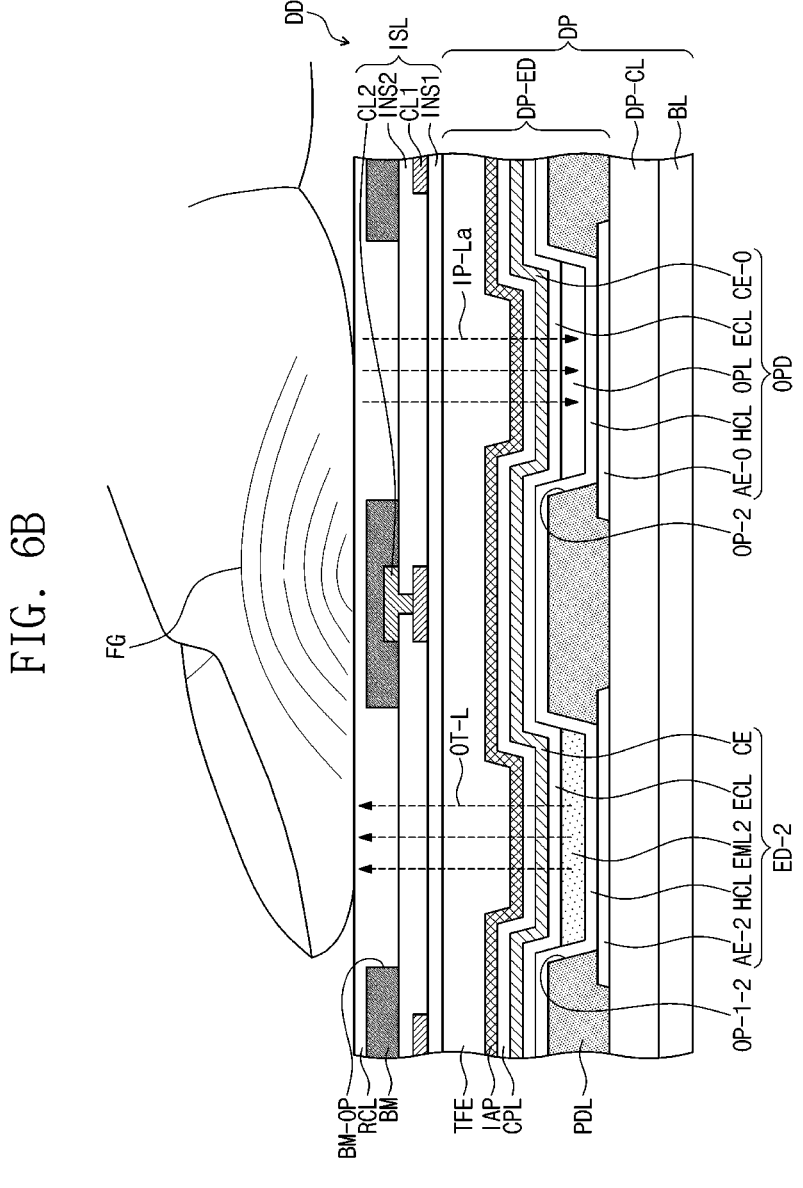
Figure 7:
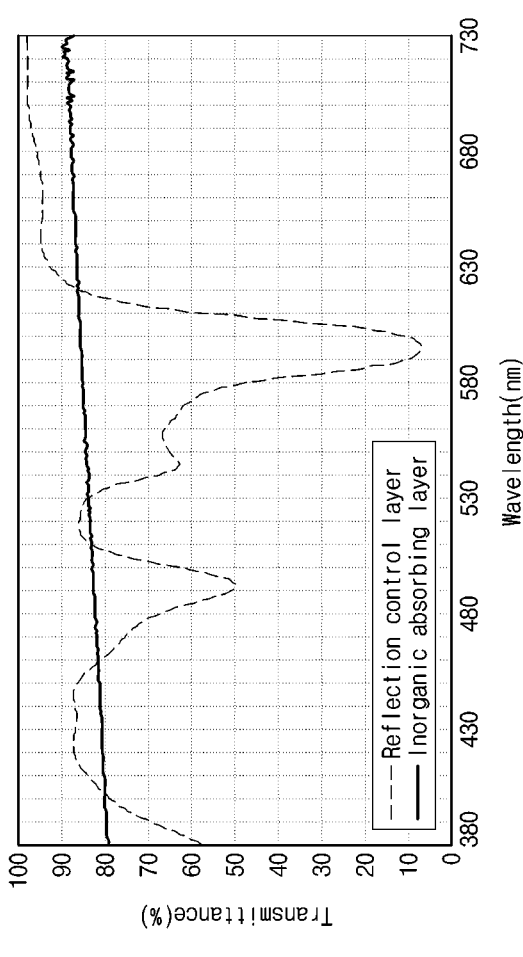
FIG. 7 is a graph showing a light transmittance of a reflection control layer and an inorganic absorbing layer as a function of a wavelength according to some embodiments of the present disclosure.

FIGS. 6A and 6B are cross-sectional views of the electronic device DD according to some embodiments of the present disclosure. FIG. 7 is a graph showing a light transmittance of the reflection control layer RCL and the inorganic absorbing layer IAP as a function of a wavelength according to some embodiments of the present disclosure.

FIG. 6A shows a cross-section of the electronic device DD corresponding to the light emitting elements ED-1 and ED-2 and one light receiving element OPD. FIG. 6B shows a cross-section of the electronic device DD corresponding to one light emitting element ED-2 of the light emitting elements ED-1 and ED-2 and the light receiving element OPD of FIG. 6A. Details of the same components described above will be applied to components of FIGS. 6A and 6B.

Referring to FIG. 6A, the display element layer DP-ED may include the light emitting elements ED-1 and ED-2 and the light receiving elements OPD. FIG. 6A shows the first and second light emitting elements ED-1 and ED-2 and one light receiving element OPD. The above descriptions on the light emitting element ED may be applied to the first and second light emitting elements ED-1 and ED-2.

The light receiving element OPD may be an optical sensor that receives and recognizes the light reflected by the external object. As an example, the light receiving element OPD may be a biometric sensor that recognizes the light reflected from the user's body part, such as a fingerprint or vein, and converts the optical signal into the electrical signal.

Each of the first light emitting element ED-1 and the second light emitting element ED-2 may include a corresponding pixel electrode of pixel electrodes AE-1 and AE-2, a common electrode CE, a hole control layer HCL, an electron control layer ECL, and a corresponding light emitting layer of light emitting layers EML1 and EML2.

The light receiving element OPD may include a first electrode AE-O, a light receiving layer OPL, and a second electrode CE-O. The first electrode AE-O of the light receiving element OPD may be called a light receiving electrode. The first electrode AE-O may be located on the same layer as a layer on which the pixel electrodes AE-1 and AE-2 of the light emitting elements ED-1 and ED-2 are located.

The pixel definition layer PDL may be provided with first openings OP-1-1 and OP-1-2 defined therethrough to expose a portion of the first pixel electrode AE-1 of the first light emitting element ED-1 and a portion of the second pixel electrode AE-2 of the second light emitting element ED-2, respectively. The portion of the first pixel electrode AE-1, which is exposed through the first opening OP-1-1, may correspond to the first light emitting area PXA1, and the portion of the second pixel electrode AE-2, which is exposed through the first opening OP-1-2, may correspond to the second light emitting area PXA2.

The pixel definition layer PDL may be provided with a second opening OP-2 defined therethrough to expose a portion of the first electrode AE-O of the light receiving element OPD. The portion of the first electrode AE-O, which is exposed through the second opening OP-2, may correspond to the transmission area TA. According to some embodiments, the pixel definition layer PDL may be provided with a plurality of second openings OP-2. The electronic device DD may include a plurality of light receiving elements OPD, and the light receiving elements OPD may be arranged to correspond to the second openings OP-2 defined through the pixel definition layer PDL.

The non-light-emitting area NPXA may be located between the light emitting areas PXA1 and PXA2 and the transmission area TA. The non-light-emitting area NPXA may surround the light emitting areas PXA1 and PXA2 and the transmission area TA. According to some embodiments, the non-light-emitting area NPXA may correspond to an area in which the pixel definition layer PDL is located.

A first light emitting layer EML1 of the first light emitting element ED-1 may be located on the first pixel electrode AE-1. A second light emitting layer EML2 of the second light emitting element ED-2 may be located on the second pixel electrode AE-2. The first light emitting layer EML1 and the second light emitting layer EML2 may be located in areas respectively corresponding to the first openings OP-1-1 and OP-1-2. The first light emitting layer EML1 and the second light emitting layer EML2 may emit lights having different colors. As an example, the first light emitting layer EML1 may emit a red light or a blue light, and the second light emitting layer EML2 may emit a green light.

The light receiving layer OPL of the light receiving element OPD may be arranged on the first electrode AE-O. The light receiving layer OPL may be located in an area overlapping the second opening OP-2 of the pixel definition layer PDL. The light receiving layer OPL may include a light receiving material that receives a light and converts the light to an electrical signal. According to some embodiments, the light receiving layer OPL may include an organic light receiving material. As an example, the light receiving layer OPL may include a conjugated polymer. The light receiving layer OPL may include a thiophene-based conjugated polymer, a benzodithiophene-based conjugated polymer, a thieno[3,4-c]pyrrole-4,6-dione(TPD)-based conjugated polymer, a diketo-pyrrole-pyrrole(DPP)-based conjugated polymer, a benzothia diazole(BT)-based conjugated polymer, etc., however, it should not be limited thereto or thereby.

The common electrode CE may be located on the first light emitting layer EML1 and the second light emitting layer EML2. The common electrode CE may be provided using an open mask and may be commonly arranged over the pixels. That is, the common electrode CE of the first light emitting element ED-1 and the second light emitting element ED-2 may be provided in the form of a single common layer.

The second electrode CE-O of the light receiving element OPD may be located on the light receiving layer OPL. The second electrode CE-O of the light receiving element OPD may include the same material as that of the common electrode CE of the light emitting elements ED-1 and ED-2 and may be formed integrally with the common electrode CE of the light emitting elements ED-1 and ED-2. That is, a conductive layer forming an electrode may overlap the first light emitting area PXA1, the second light emitting area PXA2, the transmission area TA, and the non-light-emitting area NPXA and may be formed as a common layer. A portion of the electrode, which overlaps the light emitting areas PXA1 and PXA2, may be defined as the electrode of the light emitting elements ED-1 and ED-2, and a portion of the electrode, which overlaps the transmission area TA, may be defined as the second electrode CE-O of the light receiving element OPD.

The hole control layer HCL may be located between the pixel electrodes AE-1 and AE-1 and the light emitting layers EML1 and EML2. The hole control layer HCL may be commonly arranged over the light emitting elements ED-1 and ED-2. A portion of the hole control layer HCL may be included in the light receiving element OPD. That is, a portion of the hole control layer HCL may be located between the first electrode AE-O and the light receiving layer OPL.

The electron control layer ECL may be located between the light emitting layers EML1 and EML2 and the common electrode CE. The electron control layer ECL may be commonly arranged over the light emitting elements ED-1 and ED-2. A portion of the electron control layer ECL may be included in the light receiving element OPD. That is, the portion of the electron control layer ECL may be located between the light receiving layer OPL and the second electrode CE-O.

Each of the hole control layer HCL and the electron control layer ECL may be provided as one common layer. Each of the hole control layer HCL and the electron control layer ECL may be provided as the common layer over the entire of the light emitting elements ED-1 and ED-2 and the light receiving element OPD. The hole control layer HCL and the electron control layer ECL may overlap the pixel definition layer PDL, the light emitting layers EML1 and EML2, and the light receiving layer OPL, however, they should not be limited thereto or thereby. According to some embodiments, at least one of the hole control layer HCL or the electron control layer ECL may be distinguished from the other of the hole control layer HCL and the electron control layer ECL by the pixel definition layer PDL.

The input sensing layer ISL may be located on the display panel DP. The input sensing layer ISL may be formed on the encapsulation layer TFE of the display panel DP through successive processes and may be located directly on the display panel DP. The input sensing layer ISL may include a first sensing insulating layer INS1, a first conductive layer CL1, a second sensing insulating layer INS2, and a second conductive layer CL2.

Each of the first sensing insulating layer INS1 and the second sensing insulating layer INS2 may include an inorganic layer or an organic layer. The inorganic layer may include at least one of aluminum oxide, titanium oxide, silicon oxide, silicon nitride, silicon oxynitride, zirconium oxide, or hafnium oxide. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. However, materials for the sensing insulating layers INS1 and INS2 should not be particularly limited.

The first sensing insulating layer INS1 may be located on the encapsulation layer TFE. According to some embodiments, the first sensing insulating layer INS1 may be located directly on the encapsulation layer TFE. The first conductive layer CL1 and the second conductive layer CL2 may be located above the first sensing insulating layer INS1. Each of the first conductive layer CL1 and the second conductive layer CL2 may include conductive patterns that form the input sensing layer ISL. The conductive patterns may include sensing electrodes and signal lines connected to the sensing electrodes. The second sensing insulating layer INS2 may be located between the first conductive layer CL1 and the second conductive layer CL2.

Each of the first conductive layer CL1 and the second conductive layer CL2 may have a single-layer structure or a multi-layer structure of layers stacked in the thickness direction. A conductive layer having the single-layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), zinc peroxide (ZnO2), or indium zinc tin oxide (IZTO). Further, the transparent conductive layer may include a conductive polymer such as PEDOT, a metal nanowire, a graphene, or the like.

The metal layer having the multi-layer structure may include metal layers. According to some embodiments, the metal layers may have a three-layer structure, i.e., a three-layer structure of titanium/aluminum/titanium, however, it should not be limited thereto or thereby. The metal layer having the multi-layer structure may include at least one metal layer and at least one transparent conductive layer.

One of the first conductive layer CL1 and the second conductive layer CL2 of the input sensing layer ISL may be omitted. According to some embodiments, the input sensing layer ISL may further include a third sensing insulating layer, and the third sensing insulating layer may cover the second conductive layer CL2.

The electronic device DD may include a light blocking layer BM and the reflection control layer RCL. The light blocking layer BM may be located on the input sensing layer ISL, and the reflection control layer RCL may be located on the light blocking layer BM.

The light blocking layer BM may be provided with upper openings BM-OP defined therethrough. The light blocking layer BM may be arranged to overlap the non-light-emitting area NPXA. The upper openings BM-OP may overlap the light emitting areas PXA1 and PXA2 and the transmission area TA, respectively. When viewed in a plane, a size of each of the upper openings BM-OP may be substantially the same as or greater than a size of each of the light emitting area PXA1 and PXA2 or a size of the transmission area TA, which overlap the upper openings BM-OP.

The light blocking layer BM may include a light absorbing material. As an example, the light blocking layer BM may include a black coloring agent. The black coloring agent may include a black pigment or a black dye. The black coloring agent may include a metal material, such as carbon black, chrome, etc., or an oxide thereof.

The light blocking layer BM may be arranged directly on the input sensing layer ISL. The light blocking layer BM may overlap the first conductive layer CL1 and the second conductive layer CL2 when viewed in a plane. The light blocking layer BM may cover the second conductive layer CL2 of the input sensing layer ISL. The light blocking layer BM may prevent or reduce the external light being reflected by the conductive layers CL1 and CL2 of the input sensing layer ISL.

According to some embodiments, the input sensing layer ISL may further include a sensing insulating layer covering the second conductive layer CL2, and in this case, the light blocking layer BM may be located on the sensing insulating layer located at an uppermost position of the input sensing layer ISL.

The reflection control layer RCL may be located on the input sensing layer ISL. The reflection control layer RCL may be located on the light blocking layer BM and may cover the light blocking layer BM and the upper openings BM-OP of the light blocking layer BM. The reflection control layer RCL may be formed on the input sensing layer ISL on which the light blocking layer BM is formed through an inkjet printing process.

The reflection control layer RCL may overlap the light emitting elements ED-1 and ED-2 and the light receiving element OPD and may be formed in a single layer. As the reflection control layer RCL is formed on the light emitting elements ED-1 and ED-2 and the light receiving element OPD in the single layer, a patterning process to form the reflection control layer RCL to correspond to each of the light emitting elements ED-1 and ED-2 and the light receiving element OPD may be omitted, and thus, processes for the electronic device DD may be simplified.

According to some embodiments, the reflection control layer RCL may provide a flat upper surface thereon. Accordingly, the window WM (refer to FIG. 3) may be coupled with the reflection control layer RCL without providing a separate planarization layer on the reflection control layer RCL.

The reflection control layer RCL may include a dye. The reflection control layer RCL may include a first dye having a maximum absorption wavelength (Amax) within a range from about 420 nm to about 500 nm and a second dye having the maximum absorption wavelength ($\lambda_{max}$) within a range from about 560 nm to about 620 nm. According to some embodiments, the reflection control layer RCL may include a porphyrin-based dye, a tetraazaporphyrin-based dye, etc. The reflection control layer RCL may further include a pigment in addition to the dye. The reflection control layer RCL may further include an organic pigment or an inorganic pigment.

The reflection control layer RCL and the inorganic absorbing layer IAP may serve as an anti-reflective member. The reflection control layer RCL may reduce the reflected light reflected by the metal layers such as the common electrode CE of the display panel DP.

The reflection control layer RCL may further include an infrared absorber. The infrared absorber may absorb a light in an infrared wavelength range. The infrared absorber may include a diammonium-based compound, a squarylium-based compound, a cyanine-based compound, a phthalocyanine-based compound, a dithiolene-based compound, or the like. However, a material for the infrared absorber should not be particularly limited.

The reflection control layer RCL may further include an ultraviolet absorber. The ultraviolet absorber may absorb a light in an ultraviolet wavelength range. The ultraviolet absorber may include a triazine-based compound, a benzotriazole-based compound, or the like. However, a material for the ultraviolet absorber should not be particularly limited.

FIG. 6B shows a state of the electronic device that senses a fingerprint FG corresponding to the external input. Referring to FIG. 6B, a light OT-L emitted from the light emitting element ED-2 of the electronic device DD may be reflected by an external object, e.g., the fingerprint FG of the user, and the reflected light IP-La by the external object may be incident into the light receiving element OPD. The reflected light IP-La incident into the light receiving element OPD may be within a visible light region. The light receiving element OPD may receive the reflected light IP-La incident thereto, may convert the reflected light IP-La to an electrical signal to sense the external input, and may change the driving state of the electronic device DD. Meanwhile, the reflected light IP-La may be referred to as a sensing light in the present disclosure.

In the electronic device DD, the reflected light IP-La may be incident to the light receiving element OPD after passing through the reflection control layer RCL and the inorganic absorbing layer IAP. Accordingly, a sensitivity of the light receiving element OPD may be changed depending on a transmittance of the reflection control layer RCL with respect to the reflected light IP-La and a transmittance of the inorganic absorbing layer IAP with respect to the reflected light IP-La and may be proportional to the transmittance of each the reflection control layer RCL and the inorganic absorbing layer IAP with respect to the reflected light IP-La.

Referring to FIGS. 6A and 7, the inorganic absorbing layer IAP and the reflection control layer RCL may transmit a light in blue, green, and red wavelength regions at a ratio (e.g., a set or predetermined ratio) or more. As an example, the light emitting element ED-2 located adjacent to the light receiving element OPD may emit a green light, and the reflected light IP-La may be a light in a green wavelength region. Referring to FIG. 7, each of the inorganic absorbing layer IAP and the reflection control layer RCL may transmit about 80% or more of the light in the green wavelength region. As the inorganic absorbing layer IAP and the reflection control layer RCL transmit lights in the blue, green, and red wavelength regions at a ratio (e.g., a set or predetermined ratio) or more, the reflectance of the electronic device DD with respect to the external light may be reduced without deteriorating the sensitivity of the light receiving element OPD.

In addition, the reflection control layer RCL may further include an infrared absorber and/or an ultraviolet absorber. As the reflection control layer RCL including the infrared absorber and/or the ultraviolet absorber is arranged to overlap the light receiving element OPD, the lights in infrared, near-infrared, and ultraviolet wavelength regions, which are provided from the outside, may be prevented or reduce from being provided to the light receiving element OPD. Accordingly, a sensing noise, a sensitivity reduction, and a malfunction of the light receiving element OPD, which are caused by the external light may be improved. In addition, as the reflection control layer RCL including the infrared absorber and/or the ultraviolet absorber is located, the electronic device DD may have the reduced reflectance with respect to the external light and the improved sensing characteristics without a separate light blocking member.

Referring to FIGS. 6A and 7, the inorganic absorbing layer IAP may transmit a light in a visible light region at a ratio (e.g., a set or predetermined ratio) or more. As an example, the inorganic absorbing layer IAP may transmit about 70% or more, in detail, about 80% or more, of the light in the visible light region. Accordingly, the inorganic absorbing layer IAP may reduce the reflectance with respect to the external light without decreasing a light emission efficiency of the light emitting elements ED-1 and ED-2.

The reflection control layer RCL may transmit the lights in the blue, green, and red wavelength regions at the ratio (e.g., the set or predetermined ratio) or more. Accordingly, the reflection control layer RCL may be located on the light emitting elements respectively emitting the blue, green, and red lights. That is, the reflection control layer RCL provided in the integral form may be arranged to overlap the light emitting elements emitting the lights having different colors. The reflection control layer RCL may reduce the reflectance with respect to the external light without decreasing the light emission efficiency of the light emitting elements ED-1 and ED-2. In addition, processes to form a separate anti-reflective member in each of the light emitting elements ED-1 and ED-2 are omitted, and thus, the processes for the electronic device DD may be simplified.

As the reflection control layer RCL includes the dye that absorbs a light in a specific wavelength region, colors of the electronic device DD may be controlled. As an example, as the reflection control layer RCL includes the dye that absorbs the light in the wavelength region between the blue light and the green light and the light in the wavelength region between the green light and the red light, the color of the light emitting elements ED-1 and ED-2 may not be deteriorated.

Figure 8A:
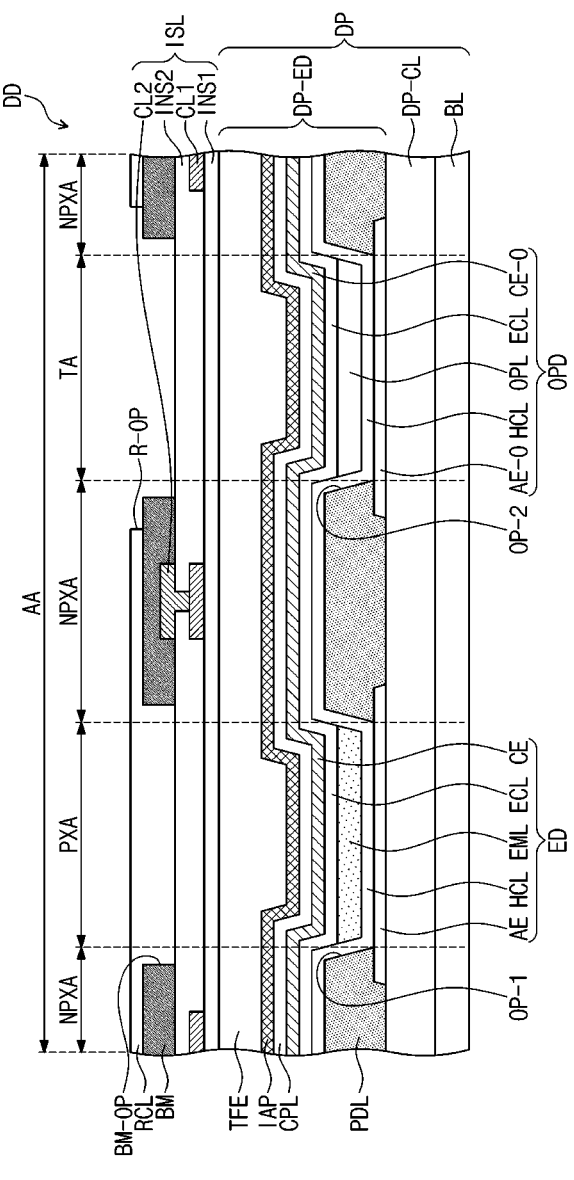
FIGS. 8A and 8B are cross-sectional views of electronic devices according to some embodiments of the present disclosure.
Figure 8B:
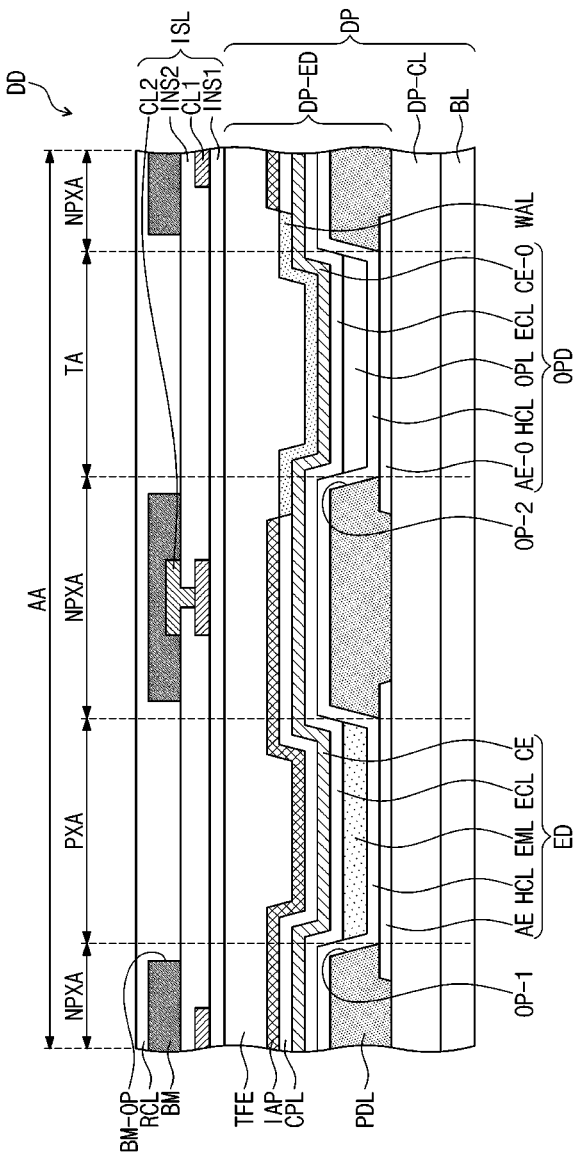

FIGS. 8A and 8B are cross-sectional views of electronic devices according to embodiments of the present disclosure. In FIGS. 8A and 8B, the same reference numerals denote the same elements in FIGS. 6A and 6B. Thus, detailed descriptions of the same elements will be omitted, and different features will be mainly described.

Referring to FIG. 8A, the reflection control layer RCL may be provided with an opening pattern R-OP defined therethrough to correspond to the transmission area TA. The reflection control layer RCL may be patterned by a photolithography process to form the opening pattern R-OP. The opening pattern R-OP may overlap the light receiving element OPD, and thus, the reflection control layer RCL may not overlap the light receiving element OPD when viewed in a plane. Accordingly, a transmittance with respect to the sensing light incident into the light receiving element OPD through the transmission area TA may be improved compared with that when the sensing light passes through the reflection control layer RCL.

Referring to FIG. 8B, the display element layer DP-ED may further include a low adhesion pattern WAL located in the transmission area TA. The low adhesion pattern WAL may be located on the light receiving element OPD. The low adhesion pattern WAL may be located on the second electrode CE-O of the light receiving element OPD.

The low adhesion pattern WAL may include a fluorine-based compound including fluorine (F). As an example, the low adhesion pattern WAL may include a fluorine-based carbon compound. The low adhesion pattern WAL may include a substance in which at least one hydrogen of the carbon compound is substituted with fluorine. As an example, the low adhesion pattern WAL may include a compound including a functional group of —CF, —CF$_2$, or —CF$_3$.

The low adhesion pattern WAL may have an optical transparency. The low adhesion pattern WAL may have a light transmittance higher than that of the common electrode CE. As an example, the low adhesion pattern WAL may have the light transmittance equal to or greater than about 80%, however, it should not be limited thereto or thereby.

According to some embodiments, the capping layer CPL may be located between the common electrode CE and the inorganic absorbing layer IAP. The capping layer CPL may be located on the low adhesion pattern WAL and then may be patterned not to overlap the transmission area TA. Accordingly, as shown in FIG. 8B, the capping layer CPL may not overlap the light receiving element OPD and the low adhesion pattern WAL when viewed in a plane, however, it should not be limited thereto or thereby. According to some embodiments, a portion of the capping layer CPL may overlap a portion of the low adhesion pattern WAL in the non-display area NPXA when viewed in a plane.

The capping layer CPL may be formed through a separate patterning process and may not overlap the transmission area TA. As an example, the capping layer CPL may be formed using a separate fine metal mask (FMM), and thus, an opening corresponding to the light receiving element OPD may be formed through the capping layer CPL. As the capping layer CPL is patterned, an upper surface of the low adhesion pattern WAL may be exposed.

Meanwhile, the capping layer CPL may be located on the common electrode CE before the low adhesion pattern WAL is located. The capping layer CPL may be formed on the common electrode CE as an integral layer to overlap the light emitting area PXA, the non-light-emitting area NPXA, and the transmission area TA, and then, the capping layer CPL may be patterned to allow the opening overlapping the transmission area TA to be formed. Then, the low adhesion pattern WAL may be located on the second electrode CE-O exposed through the opening defined through the capping layer CPL.

The inorganic absorbing layer IAP may be located on the capping layer CPL. The inorganic absorbing layer IAP may be located on the capping layer CPL patterned by a vacuum deposition method. The inorganic absorbing layer IAP may be patterned and may not be located on the low adhesion pattern WAL due to the low adhesion pattern WAL. Due to an influence of surface properties of the low adhesion pattern WAL, an adhesion between the low adhesion pattern WAL and the inorganic absorbing layer IAP may be lowered, and accordingly, the inorganic absorbing layer IAP may not be stably formed on the low adhesion pattern WAL. Therefore, the inorganic absorbing layer IAP may be patterned such that the opening having a shape corresponding to that of the low adhesion pattern WAL is formed. In the present disclosure, the opening defined through the inorganic absorbing layer IAP may be defined as a transmissive opening.

According to some embodiments, the electronic device DD may have a structure in which the capping layer CPL and the inorganic absorbing layer IAP are removed in the transmission area TA, and the light receiving element OPD may not overlap the capping layer CPL and the inorganic absorbing layer IAP when viewed in a plane. Accordingly, the transmittance with respect to the sensing light incident into the light receiving element OPD through the transmission area TA may be improved compared with the transmittance when the sensing light travels through the capping layer CPL and the inorganic absorbing layer IAP. In addition, as the capping layer CPL is located under the inorganic absorbing layer IAP, the reflectance with respect to the external light may be effectively reduced without decreasing a light emission efficiency of the light emitting element ED.

Figure 9A:
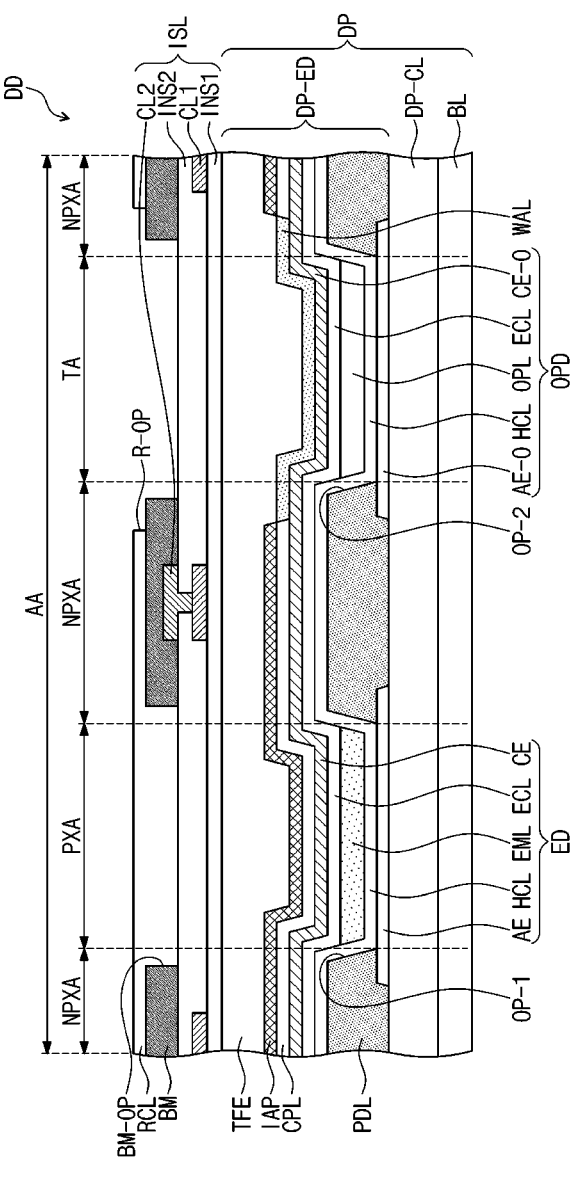
FIGS. 9A-D are cross-sectional views of an electronic device according to some embodiments of the present disclosure.
Figure 9B:
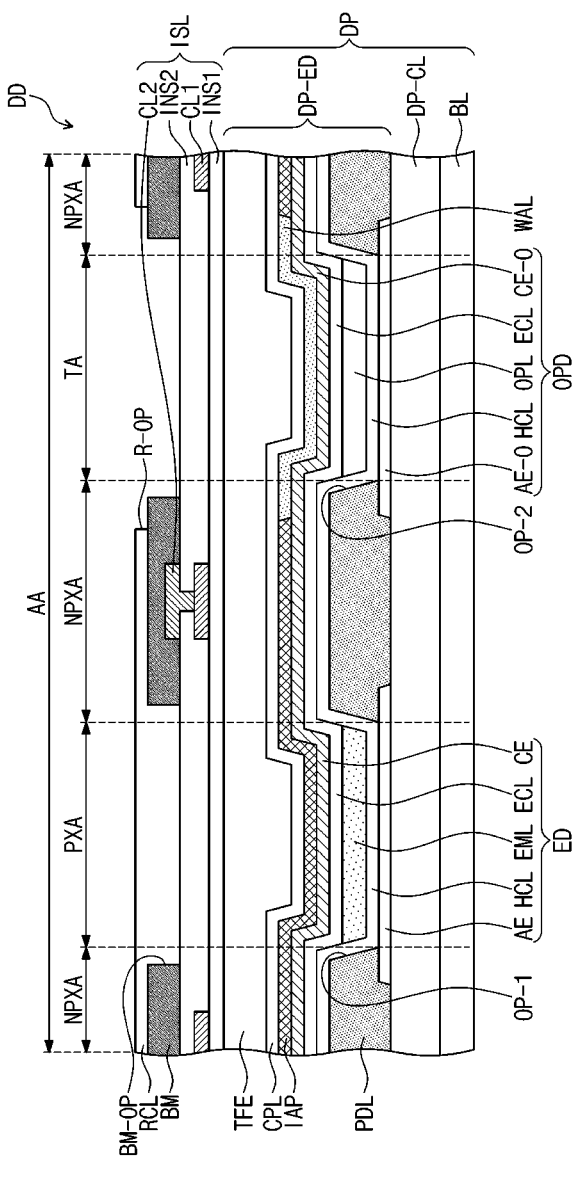
Figure 9C:
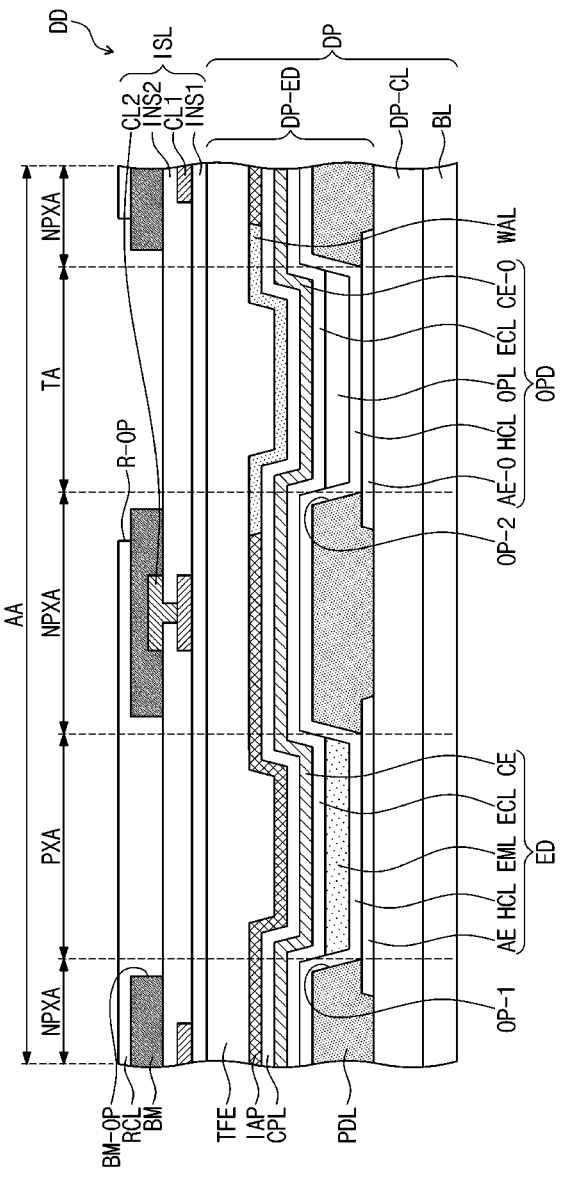
Figure 9D:
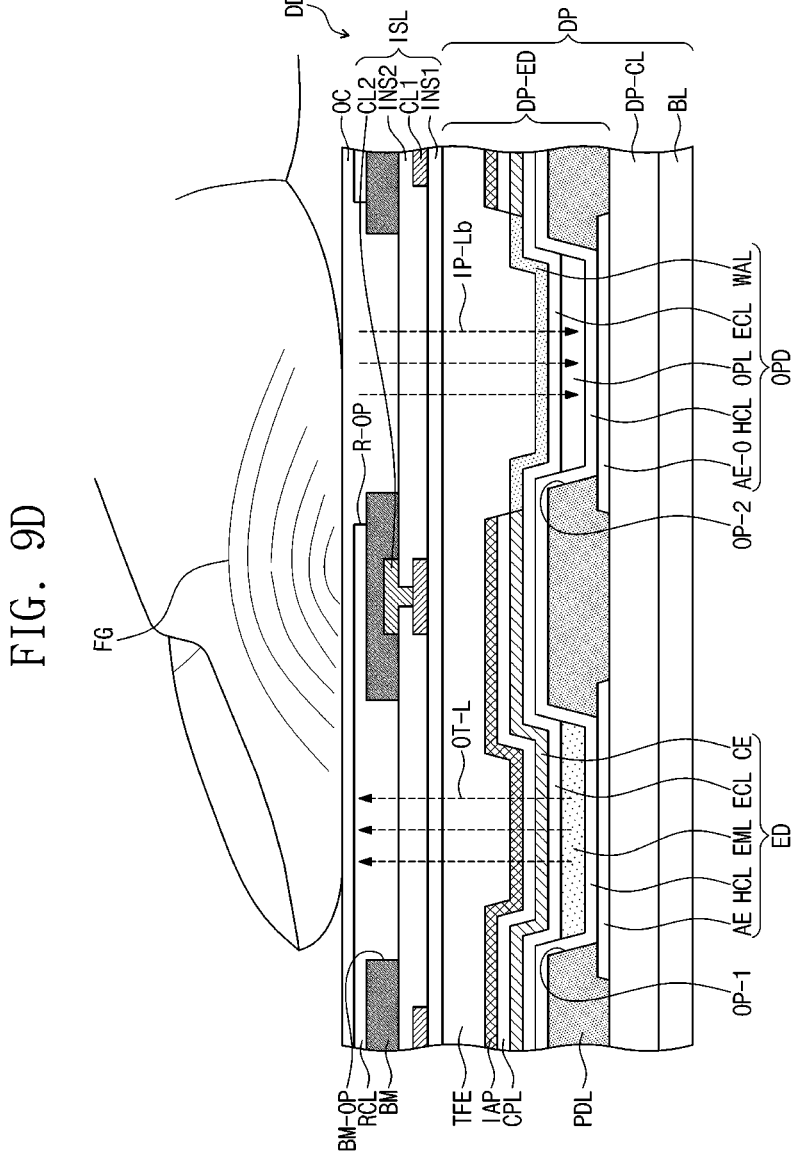

FIGS. 9A to 9D are cross-sectional views of electronic devices according to embodiments of the present disclosure. In FIGS. 9A and 9D, the same reference numerals denote the same elements of the above-mentioned electronic device. Thus, detailed descriptions of the same elements will be omitted, and different features will be mainly described.

Referring to FIG. 9A, the reflection control layer RCL of the electronic device DD may be provided with the opening pattern R-OP overlapping the light receiving element OPD as the embodiments shown with respect to FIG. 8A, the electronic device DD may further include the low adhesion pattern WAL as the embodiments shown with respect to FIG.

8B, and the capping layer CPL and the inorganic absorbing layer IAP may not overlap the light receiving element OPD when viewed in a plane.

That is, the electronic device DD may include the inorganic absorbing layer IAP and the reflection control layer RCL that are patterned such that portions thereof are removed in areas corresponding to the transmission area TA in which the light receiving element OPD is arranged as shown in FIG. 9A. Accordingly, the transmittance with respect to the sensing light incident into the light receiving element OPD may be improved, and the sensitivity of the light receiving element OPD may be improved. In addition, as the electronic device DD may include the inorganic absorbing layer IAP located on the light emitting element ED and the reflection control layer RCL located above the inorganic absorbing layer IAP, the electronic device DD may have the reduced reflectance with respect to the external light.

Referring to FIG. 9B, when compared with the electronic device DD of FIG. 9A, the capping layer CPL of the electronic device DD may be located on the inorganic absorbing layer IAP. The capping layer CPL may be provided over the pixels as a common layer. The capping layer CPL may overlap the light emitting area PXA, the non-light-emitting area NPXA, and the transmission area TA when viewed in a plane.

According to some embodiments, the inorganic absorbing layer IAP may be formed by placing the low adhesion pattern WAL on the light receiving element OPD and depositing the low adhesion pattern WAL on the common electrode CE. Due to the influence of the surface characteristics of the low adhesion pattern WAL, the adhesion between the low adhesion pattern WAL and the inorganic absorbing layer IAP may be lowered, and the inorganic absorbing layer IAP may be patterned and may not be located on the low adhesion pattern WAL.

As the low adhesion pattern WAL is located on the light receiving element OPD, the inorganic absorbing layer IAP may be prevented from overlapping the transmission area TA, and the inorganic absorbing layer IAP may be relatively stably removed from a specific area without a separate additional patterning process.

After the inorganic absorbing layer IAP is formed, the capping layer CPL may be located on the inorganic absorbing layer IAP. The process of patterning the capping layer CPL may be omitted, and the capping layer CPL may overlap the light receiving element OPD when viewed in a plane.

Referring to FIG. 9C, the capping layer CPL may be located between the common electrode CE and the inorganic absorbing layer IAP and may overlap the transmission area TA. The capping layer CPL may be formed on the common electrode CE in an integral form and may overlap the light emitting area PXA, the non-light-emitting area NPXA, and the transmission area TA.

The low adhesion pattern WAL may be located on the capping layer CPL to overlap the transmission area TA. After the low adhesion pattern WAL is arranged, the inorganic absorbing layer IAP may be formed on the capping layer CPL. The inorganic absorbing layer IAP may be patterned and may not be located on the transmission area TA due to the low adhesion pattern WAL. Accordingly, the inorganic absorbing layer IAP may not overlap the light receiving element OPD when viewed in a plane.

As the process of patterning the capping layer CPL is omitted, a manufacturing process of the electronic device DD may be simplified. In addition, as the low adhesion pattern WAL is formed on the capping layer CPL having a relatively high adhesion with respect to the low adhesion pattern WAL, the low adhesion pattern WAL may be more easily formed. In addition, as the capping layer CPL is located under the inorganic absorbing layer IAP, the reflectance of the electronic device DD with respect to the external light may be effectively reduced.

FIG. 9D shows a state in which the electronic device DD of FIG. 9A senses the fingerprint FG that is the external input. Referring to FIG. 9D, the electronic device DD may further include an overcoat layer OC located on the reflection control layer RCL. The overcoat layer OC may cover a step difference of the patterned reflection control layer RCL and may provide a flat upper surface. The overcoat layer OC may have an optically transparent property. The light transmittance of the overcoat layer OC may be higher than the light transmittance of the reflection control layer RCL. The overcoat layer OC may include a polymer resin, such as an acrylic resin, an epoxy resin.

However, according to some embodiments, the adhesive layer AL (refer to FIG. 3) and the window WM (refer to FIG. 3) may be located on the patterned reflection control layer RCL. The reflection control layer RCL may be coupled with the window WM (refer to FIG. 3) by the adhesive layer AL (refer to FIG. 3).

Referring to FIG. 9D, the light OT-L emitted from the light emitting element ED may be reflected by the fingerprint FG of the user, a reflected light IP-Lb reflected by the fingerprint FG may be incident into the light receiving element OPD. When compared with the embodiments shown with respect to FIG. 6B, the reflected light IP-Lb may be incident into the light receiving element OPD without passing through the reflection control layer RCL, the inorganic absorbing layer IAP, and the capping layer CPL. According to some embodiments, the reflected light IP-Lb may pass through the overcoat layer OC and the low adhesion pattern WAL, which have a relatively high light transmittance compared with the reflection control layer RCL, the inorganic absorbing layer IAP, and the capping layer CPL. Accordingly, the light transmittance with respect to the sensing light traveling toward the light receiving element OPD may be improved, and the sensitivity of the light receiving element OPD may be improved.

Figure 10:
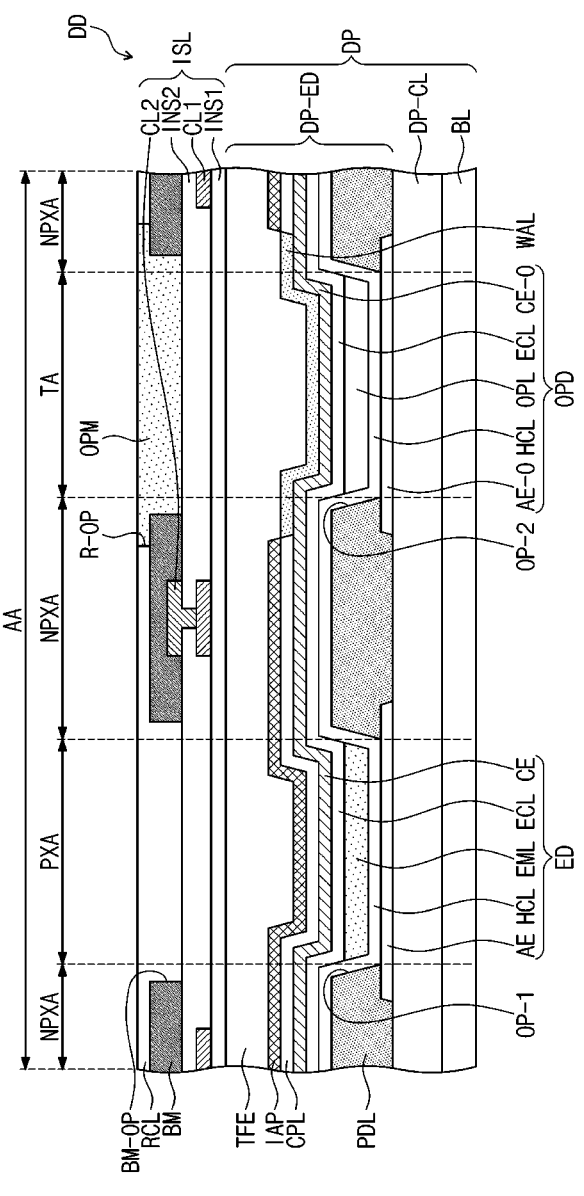
FIG. 10 is a cross-sectional view of an electronic device according to some embodiments of the present disclosure.

FIG. 10 is a cross-sectional view of an electronic device according to some embodiments of the present disclosure. In FIG. 10, the same reference numerals denote the same elements of FIG. 9A. Thus, detailed descriptions of the same elements will be omitted, and different features will be mainly described.

Referring to FIG. 10, the electronic device DD may further include an organic pattern portion OPM located in the opening pattern R-OP of the reflection control layer RCL. The organic pattern portion OPM may be located in the transmission area TA, and the organic pattern portion OPM may overlap the light receiving element OPD when viewed in a plane.

The organic pattern portion OPM may include a dye or a pigment. As an example, the organic pattern portion OPM may include at least one of a green dye, a green pigment, a yellow dye, or a yellow pigment. The organic pattern portion OPM may include a phthalocyanine-based dye, a quinophthalone-based dye, etc. However, a material for the organic pattern portion OPM should not be limited thereto or thereby.

The organic pattern portion OPM may prevent or reduce light in red and blue wavelength regions, which are incident thereinto from the outside, being supplied to the light receiving element OPD. According to some embodiments, the sensing light incident into the light receiving element OPD may be a reflected light that is the green light emitted from the light emitting element ED and reflected by the external object. In a case where the external lights in the red and blue wavelength regions are incident into the light receiving element OPD, a sensing noise, a sensitivity reduction, and a malfunction of the light receiving element OPD may occur. However, when the organic pattern portion OPM is located in the transmission area TA, the sensing reliability of the light receiving element OPD may be improved.

The dye included in the organic pattern portion OPM may be different from the dye included in the reflection control layer RCL. The organic pattern portion OPM may be arranged to overlap the light receiving element OPD when viewed in a plane to reduce the sensing noise of the light receiving element OPD, and the reflection control layer RCL may be arranged to overlap the light emitting element ED when viewed in a plane to reduce the reflectance with respect to the external light.

The organic pattern portion OPM may further include an infrared absorber. The infrared absorber may absorb a light in an infrared wavelength region. The infrared absorber may include a diimmonium-based compound, a squarylium-based compound, a cyanine-based compound, a phthalocyanine-based compound, a dithiolene-based compound, or the like. However, a material for the infrared absorber should not be limited thereto or thereby.

The organic pattern portion OPM may further include an ultraviolet absorber. The ultraviolet absorber may absorb a light in an ultraviolet wavelength region. The ultraviolet absorber may include a triazine-based compound, a benzotriazole-based compound, or the like. However, a material for the ultraviolet absorber should not be limited thereto or thereby.

As the organic pattern portion OPM including the infrared absorber and/or the ultraviolet absorber is arranged to overlap the light receiving element OPD, the lights in infrared, near-infrared, and ultraviolet wavelength regions, which are provided from the outside, may be prevented from being provided to the light receiving element OPD. Accordingly, the sensing noise, the sensitivity reduction, and the malfunction of the light receiving element OPD, which are caused by the external light, may be improved.

The electronic device may include the light emitting element and the light receiving element and may include the inorganic absorbing layer and the reflection control layer located on the light emitting element and the light receiving element. The inorganic absorbing layer and the reflection control layer may reduce the reflection of the external light, and thus, the light emission efficiency of the electronic device may be improved. In addition, the inorganic absorbing layer and the reflection control layer may reduce the noise of the external light, and thus, the sensing reliability of the light receiving element may be improved.

According to some embodiments, an electronic device may include the inorganic absorbing layer and the reflection control layer, which are patterned and partially removed in the area corresponding to the transmission area in which the light receiving element is located, and accordingly, the light transmittance with respect to the sensing light incident into the light receiving element may be improved. As a result, the sensitivity of the light receiving element may be improved. In addition, the electronic device may include the inorganic absorbing layer and the reflection control layer located on the light emitting element, and thus, the reflectance of the electronic device with respect to the external light may be reduced. The inorganic absorbing layer of the electronic device may be relatively easily patterned due to the low adhesion pattern located on the light receiving element.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims, and their equivalents.

What is claimed is:

1. An electronic device comprising:

a base layer;

a display element layer on the base layer; and a reflection control layer on the display element layer and comprising a dye, the display element layer comprising:

a pixel definition layer having first, second, and third openings formed therethrough;

a first light emitting element corresponding to the first opening and emitting a first light;

a second light emitting element corresponding to the second opening and emitting a second light different from the first light;

a light receiving element corresponding to the third opening; and an inorganic absorbing layer on the first and second light emitting elements, and wherein the reflection control layer overlaps the first light emitting element and the second light emitting element.

2. The electronic device of claim 1, wherein the reflection control layer comprises a first dye having a maximum absorption wavelength within a range of 420 nm to 500 nm and a second dye having a maximum absorption wavelength within a range of 560 nm to 620 nm.

3. The electronic device of claim 1, wherein the reflection control layer comprises at least one of a porphyrin-based dye or a tetraazaporphyrin-based dye.

4. The electronic device of claim 1, wherein the reflection control layer further comprises at least one of an infrared absorber or an ultraviolet absorber.

5. The electronic device of claim 1, wherein the reflection control layer has an opening pattern formed therethrough, and the opening pattern overlaps the light receiving element in a plan view.

6. The electronic device of claim 5, further comprising an organic pattern portion in the opening pattern, wherein the organic pattern portion comprises at least one of a green dye or a yellow dye.

7. The electronic device of claim 6, wherein the organic pattern portion comprises at least one of a phthalocyanine-based dye or a quinophthalone-based dye.

8. The electronic device of claim 6, wherein the organic pattern portion further comprises an infrared absorber, and the infrared absorber comprises at least one of a diimmonium-based compound, a squarylium-based compound, a cyanine-based compound, a phthalocyanine-based compound, or a dithiolene-based compound.

9. The electronic device of claim 6, wherein the organic pattern portion further comprises an ultraviolet absorber, and the ultraviolet absorber comprises at least one of a triazine-based compound or a benzotriazole-based compound.

10. The electronic device of claim 1, wherein the display element layer further comprises a low adhesion pattern on the light receiving element, and the inorganic absorbing layer does not overlap the low adhesion pattern in a plan view.

11. The electronic device of claim 10, wherein the low adhesion pattern comprises a fluorine-based compound.

12. The electronic device of claim 1, wherein the display element layer further comprises a capping layer on or under the inorganic absorbing layer, and the capping layer overlaps the first and second light emitting elements and the light receiving element in a plan view.

13. The electronic device of claim 1, wherein the display element layer further comprises a capping layer between the inorganic absorbing layer and the first and second light emitting elements, and the capping layer does not overlap the light receiving element in a plan view.

14. The electronic device of claim 1, wherein the inorganic absorbing layer comprises a transition metal, a post-transition metal, a lanthanide metal, or an alloy of two or more metals selected from the transition metal, the post-transition metal, and the lanthanide metal.

15. The electronic device of claim 1, further comprising:

an input sensing layer between the display element layer and the reflection control layer; and a light blocking layer on the input sensing layer and having upper openings formed therethrough, wherein the input sensing layer comprises:

a first conductive layer on the display element layer;

a second conductive layer on the first conductive layer; and a sensing insulating layer between the first conductive layer and the second conductive layer, and the upper openings overlap the first, second, and third openings, respectively.

16. An electronic device comprising:

a display element layer comprising a light emitting area, a transmission area, and a non-light-emitting area surrounding the light emitting area and the transmission area; and a reflection control layer on the display element layer and comprising a dye, the display element layer comprising:

a light emitting element in the light emitting area;

a light receiving element in the transmission area;

a low adhesion pattern on the light receiving element; and an inorganic absorbing layer on the light emitting element, wherein the inorganic absorbing layer has a transmission opening formed therethrough to overlap the low adhesion pattern in a plan view.

17. The electronic device of claim 16, wherein the display element layer further comprises a capping layer under the inorganic absorbing layer and overlapping the light emitting area and the transmission area, and the low adhesion pattern is on the capping layer.

18. The electronic device of claim 16, wherein the display element layer further comprises a capping layer under the inorganic absorbing layer and provided with an opening defined therethrough to overlap the transmission area, and the low adhesion pattern is in the opening of the capping layer.

19. The electronic device of claim 16, wherein the display element layer further comprises a capping layer on the inorganic absorbing layer and overlapping the light emitting area and the transmission area, and the capping layer covers the low adhesion pattern.

20. The electronic device of claim 16, wherein the reflection control layer has an opening pattern defined therethrough, and the opening pattern overlaps the transmission opening in a plan view.

\* \* \* \* \*